US006934884B1

(12) United States Patent
Wakabayashi et al.

(10) Patent No.: US 6,934,884 B1
(45) Date of Patent: Aug. 23, 2005

(54) ONE-CHIP MICROCOMPUTER AND CONTROL METHOD THEREOF AS WELL AS AN IC CARD HAVING SUCH A ONE-CHIP MICROCOMPUTER

(75) Inventors: Masaki Wakabayashi, Tenri (JP); Kazuhiro Yaegawa, Yamatokoriyama (JP); Masaaki Tanno, Hadano (JP); Hiroki Suto, Isehara (JP); Tadao Takeda, Ebina (JP)

(73) Assignees: Sharp Kabushiki Kaisha, Osaka (JP); Nippon Telegraph and Telephone Corporation, Osaka (JP)

( * ) Notice: Subject to any disclaimer, the term of this patent is extended or adjusted under 35 U.S.C. 154(b) by 0 days.

(21) Appl. No.: 09/568,683

(22) Filed: May 11, 2000

(30) Foreign Application Priority Data

| May 11, 1999 | (JP) | ................................. 11-130297 |
| Apr. 7, 2000 | (JP) | ............................. 2000-106954 |

(51) Int. Cl.$^7$ ............................................ G06F 11/00
(52) U.S. Cl. ....................................... 714/30; 714/733
(58) Field of Search ............................. 714/30, 733, 32

(56) References Cited

U.S. PATENT DOCUMENTS

| 5,638,382 A | * | 6/1997 | Krick et al. ................. 714/733 |
| 5,960,009 A | * | 9/1999 | Gizopoulos et al. ........ 714/742 |
| 6,249,893 B1 | * | 6/2001 | Rajsuman et al. ........... 714/741 |
| 6,543,019 B2 | * | 4/2003 | Kniffler et al. ............. 714/733 |

FOREIGN PATENT DOCUMENTS

| EP | 0 075 713 A | 4/1983 |
| JP | 57-207347 A | 12/1982 |
| JP | 02 023432 A | 1/1990 |
| JP | 03-089182 A | 4/1991 |
| JP | A10143386 | 5/1998 |
| KR | 1996-15221 | 5/1996 |

OTHER PUBLICATIONS

Tanenbaum, Andrew S., Structured Computer Organization, 1984, Prentice-Hall, Second Edition.*

* cited by examiner

Primary Examiner—Robert Beausoliel
Assistant Examiner—Marc Duncan
(74) Attorney, Agent, or Firm—Birch, Stewart, Kolasch & Birch, LLP.

(57) ABSTRACT

In order to provide a built-in self testing function, a one-chip microcomputer is equipped with an activation register for activating the test operation and a built-in self test activation pattern generator for setting initial values at test control circuits (pseudo random number generator, logical circuit testing compressor, pattern generator, and memory testing compressor). In accordance with an instruction from the CPU, a built-in self test is activated so that the results of tests of the memory and the group of logical circuits are read from the memory testing compressor and the logical circuit testing compressor, and respectively compared with expected values preliminarily stored in the memory in the one-chip microcomputer; thus, the results are diagnosed. Thus, it is possible to carry out a built-in self test without using a plurality of exclusively-used test terminals.

34 Claims, 14 Drawing Sheets

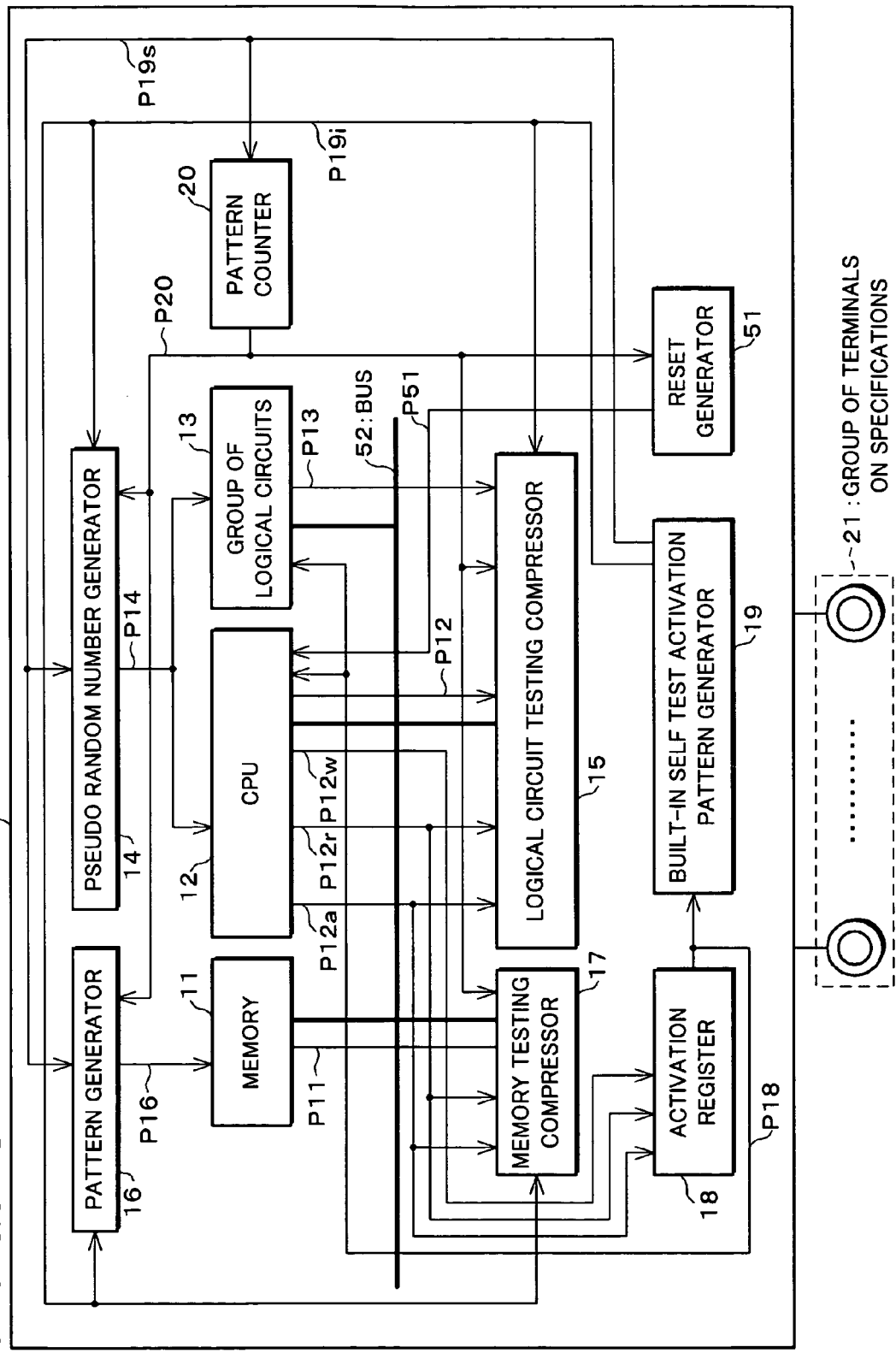
F I G. 5

ONE-CHIP MICROCOMPUTER AND CONTROL METHOD THEREOF AS WELL AS AN IC CARD HAVING SUCH A ONE-CHIP MICROCOMPUTER

FIELD OF THE INVENTION

The present invention relates to a test circuit for a one-chip microcomputer, and more particularly concerns a one-chip microcomputer provided with a built-in self test circuit in which a built-in CPU carries out the activation of the built-in self test and diagnosis on the results and a controlling method therefor, as well as an IC card equipped with such a microcomputer.

BACKGROUND OF THE INVENTION

One of the test systems for a group of logical circuits in a one-chip microcomputer is a system for inspecting its functions. This is a test system for checking to see whether or not the one-chip microcomputer satisfies specifications assumed by the designer, in which the operation is traced in accordance with its specifications.

As the scale of a one-chip microcomputer becomes greater and complicated, the above-mentioned system for testing functions comes to fail to carry out detections having high failure detection rates, resulting in failure in ensuring sufficient quality. Therefore, a scan test method has generally been used in which memory elements in the circuit are replaced by exclusively-used cells that are connected in a manner analogous to the shift register so that the value setting and reading are carried out with respect to the memory elements in the circuit.

In the above-mentioned scan test method, the exclusively-used cells by which the memory elements are replaced are generally referred to as scan cells, and a plurality of kinds of them exist. For example, in one kind of scan cells, a selector circuit is added to the data input terminal of the memory element.

Here, referring to respective conceptual drawings (FIGS. 12 and 13), an explanation will be given of a group of logical circuits and a scanning test system.

As illustrated in FIG. 12, a group of logical circuits 103 is constituted by memory elements 101 and combination circuits 102. As illustrated in FIG. 8, this scanning test system is classified into memory element sections 203 having only memory elements 202 and combination circuit sections 205 having only combination circuits 204; thus, a group of logical circuits 201 are formed. Then, a test is carried out on the group of logical circuits 201 by repeating two modes, that is, a shift mode and a capture mode.

The switching between the shift mode and the capture mode is carried out by a terminal generally referred to as a test enable terminal which has a function for selecting input data of a selector circuit that is newly added to the scan cell. In other words, the test enable terminal is used so as to effect control as to whether or not the scan cells are connected in a manner analogous to the shift register.

The above-mentioned shift mode is a mode for setting the values of the respective scan cells with the test enable terminal being connected in a manner analogous to the shift register. In contrast, in the capture mode, the test enable terminal is set so as not to be connected in a manner analogous to the shift register, with the result that the combination circuits are operated so that the scan cell is allowed to acquire their values.

Next, referring to FIG. 13, an explanation will be given of the sequence of the scan test.

First, the mode of the group of logical circuits 201 is set in the shift mode by using the test enable terminal so that values required for the test of the combination circuit section 205 are set on all the scan cells. Thereafter, the mode of the group of the logical circuits 201 is switched to the capture mode, and one cycle of a clock signal S206 having a clock cycle is inputted to the scan cells. Then, the mode of the logical circuit group 201 is again switched to the shift mode, and the clock signal S206 is inputted thereto so that the values of the scan cells are successively read, and compared with expected values. Simultaneously, new values required for the next test on the combination circuit section 205 are set on all the scan cells. Thereafter, the tests are carried out by repeating the above-mentioned process.

Here, a test enable signal 208 in FIG. 13 is a signal line connected to the test enable terminal, and the shift mode is set when it goes "High" and the capture mode is set when it goes "Low". A selector 207 selects the signal from the memory elements 202 when the test enable signal 208 goes "High", and also selects the signal from the combination circuit 205 when it goes "Low".

Next, referring to FIG. 14, an explanation will be given on a conventional one-chip microcomputer having an built-in self test function.

A conventional one-chip microcomputer 300 having the built-in self test function is constituted by a memory 301, a CPU 302, a group of logical circuits 303, a pseudo random number generator 304, a logical circuit test compressor 305, a pattern counter 312, a pattern generator 306, a memory test compressor 307, a JTAG circuit 308, a group of exclusively-used test terminals 309 and a group of terminals 310 on specifications. The memory 301, the CPU 302, the group of logical circuits 303 are connected to one another through a bus 311.

A program for controlling the CPU 302 is stored in the memory 301. The group of logical circuits 303 is constituted by circuits that realize specified operations of the one-chip microcomputer 300. The random number generator 304 generates random numbers as test patterns for inspecting the CPU 302 and the group of logical circuits 303, and is formed by, for example, a linear feedback shift register constituted by shift registers having feedbacks. The logical circuit test compressor 305, which compresses values that are outputted on demand by the CPU 302 and the group of logical circuits 303 during the test, is formed by, for example, the above-mentioned linear feedback shift register.

The pattern counter 312, which is used for monitoring the built-in self test while its process is being executed, is constituted by a counter circuit. Here, the pattern counter 312 controls the completions of the operations of the pseudo random number generator 304, the logical circuit test compressor 305, the pattern generator 306 and the memory test compressor 307.

The pattern generator 306 generates test patterns used for inspecting the memory 301. The memory test compressor 307 compresses values that are outputted from the memory 301 on demand during the test, and is formed by, for example, the above-mentioned linear feedback shift register. The JTAG circuit 308 is formed by a circuit conforming to the standard of IEEE 1149.1. In other words, the JTAG circuit 308 is provided with a circuit in which instructions and additional data for the test are read by the constituent elements in series with each other, and from which the data showing the results of the execution of the instruction is read in series with each other. Here, the IEEE 1149.1 is a standard specification in which the standard test terminal specification and test architecture are determined by JTAG (joint test action group).

The group of exclusively-used test terminals 309 is provided with a TDI terminal, TDO terminal, TCK terminal and TMS terminal in accordance with the standard of the IEEE 1149.1. A signal having a clock cycle is inputted to the TCK terminal. A signal for controlling a test operation is inputted to the TMS terminal so that a sampling operation is carried out in synchronism with the signal inputted from the TCK terminal. Instructions and additional data are inputted to the TDI terminal in series with each other so that a sampling operation is carried out in synchronism with the signal inputted from the TCK terminal. Data indicating the results is outputted from the TDO terminal in series with each other, and the alternation of the output value is carried out in synchronism with the signal inputted to the TCK terminal.

The group of terminals 310 on specifications include an input terminal, an output terminal and an input-output terminal based upon the specification of a one-chip microcomputer 300.

The conventional one-chip microcomputer 300 having an built-in self test function is controlled by the group of exclusively-used test terminals 309. In accordance with the instructions and additional data from the group of exclusively-used test terminals 309, the JTAG circuit 308 sets the initial stages of the pseudo random number generator 304, the pattern generator 306, the logical circuit test compressor 305 and the memory test compressor 307, and activates an built-in self test.

When the built-in self test has been activated, a signal generated in the pseudo random number generator 304 is inputted as a test pattern to the CPU 302 and the group of logical circuits 303 which have been allowed to carry out a scan test. Then, data, released from the CPU 302 and the group of logical circuits 303, are compressed by the logical circuit test compressor 305 so that the resulting value is provided as the result of the test of the built-in self test of the CPU 302 and the group of logical circuits 303.

Simultaneously with this, the pattern generator 306 outputs a test pattern to the memory 301, and the data outputted from the memory 301 is compressed by the memory test compressor 307, and the resulting value is provided as the result of the test of the built-in self test of the memory 301.

After the completion of the built-in self test, the operations of the logical circuit test compressor 305 and the memory test compressor 307 are stopped by the pattern counter 312, and in accordance with the instructions and additional data from the group of exclusively-used test terminals 309, the result of the test of the built-in self test of the CPU 302 and the group of logical circuits 303 and the result of the test of the built-in self test of the memory 301 are read out, and compared with expected values outside the one-chip microcomputer 300 so as to make a judgment.

However, in the above-mentioned conventional arrangement, since the one-chip microcomputer having the built-in self test function requires the exclusively-used test terminals, the resulting problem is an increase in the number of the terminals of the one-chip microcomputer.

For example, in the case of IC cards, the number of terminals, coordinate positions and functions and specifications of the terminals are specified by the ISO (International Organization for Standardization) 7816 and the number of terminals are limited to eight. For this reason, even through the built-in self test needs to be carried out, it is not practical to increase the number of exclusively-used test terminals so as to carry out the test.

SUMMARY OF THE INVENTION

The objective of the present invention is to provide a one-chip microcomputer which can execute a built-in self test without the need for exclusively-used test terminals that cannot be included in its terminals that is limited in number, a controlling method thereof and an IC card equipped with such a one-chip microcomputer.

In order to solve the above-mentioned objective, the one-chip microcomputer of the present invention is provided with: a CPU, a memory in which a program for controlling the operation of the CPU is stored and a group of logical circuits that are connected to a bus, as well as a self test control circuit for inputting test patterns to the group of logical circuits and the memory and for detecting the respective output signals, in accordance with an instruction from the CPU; and a self test activation circuit for setting an initial value for the self test control circuit and for activating the self test control circuit, in accordance with an instruction from the CPU.

Moreover, in order to achieve the above-mentioned objective, the control method for a one-chip microcomputer of the present invention, which is a control method for a one-chip microcomputer provided with CPU, a memory in which a program for controlling operations of the CPU is stored and a group of logical circuits, is provided with steps of: setting an initial value for a self test control circuit so as to activate the self test control circuit in accordance with an instruction from the CPU (first step), and allowing the self test control circuit to input test patterns to the group of logical circuits and the memory so as to detect the respective output signals, in accordance with an instruction from the CPU (second step).

With the above-mentioned arrangement or method, a built-in self test is activated (the self test activation circuit, the first step) in accordance with an instruction from the CPU, and output signals of the group of logical circuits and the memory are detected (the self test control circuit, the second step). Therefore, upon completion of the built-in self test, the results of the test are diagnosed based upon the output signals in the one-chip microcomputer in accordance with an instruction from the CPU. In other words, the CPU, built in the one-chip microcomputer, can control the activation of the built-in self test and the diagnosis on the results of the self test.

Therefore, it is possible to carry out the built-in self test without the need for exclusively-used test terminals that have been conventionally required and for complex control externally given. Since the above-mentioned arrangement or method solves the problem of an increase in the number of terminals in a one-chip microcomputer, it is possible to put the built-in self test into practice even in the case of one-chip microcomputers such as IC cards, which have fewer terminals.

In order to achieve the above-mentioned objective, the one-chip microcomputer of the present invention is provided with: a CPU; a memory in which a program for controlling operations of the CPU is stored; a group of logical circuits; a self test control circuit for inputting test patterns to the CPU, the group of logical circuits and the memory and for detecting the respective output signals, in accordance with an instruction from the CPU; a self test activation circuit for setting an initial value for the self test control circuit and for activating the self test control circuit, in accordance with the instruction from the CPU; and a test-result output circuit for outwardly outputting the output signals from the CPU, the group of logical circuits and the memory detected by the self test control circuit.

Moreover, in order to achieve the above-mentioned objective, the control method for a one-chip microcomputer of the present invention, which is a control method for a one-chip microcomputer provided with a CPU, a memory in which a program for controlling operations of the CPU is stored and a group of logical circuits, is provided with the steps of: setting an initial value for a self test control circuit so as to activate the self test control circuit in accordance with an instruction from the CPU (third step), allowing the self test control circuit to input test patterns to the CPU, the group of logical circuits and the memory so as to detect the respective output signals in accordance with an instruction of the CPU (fourth step), and outwardly outputting the output signals from the CPU, the group of logical circuits and the memory detected by the self test control circuit (fifth step).

With the above-mentioned arrangement or method, a built-in self test is activated (the self test activation circuit, the third step) in accordance with the instruction from the CPU, and output signals of the CPU, the group of logical circuits and the memory are detected (the self test control circuit, the fourth step). Then, upon completion of the built-in self test, these output signals are outwardly outputted in accordance with the instruction from the CPU (the test-result output circuit), the fifth step).

Since the activation of the built-in self test and the detection of the output signals are controlled by the CPU built in a one-chip microcomputer, it is possible to carry out the built-in self test without the need for exclusively-= used test terminals that have been conventionally required and for complex control externally given.

Moreover, upon completion of the built-in self test, based upon the output signals from the CPU, the group of logical circuits and the memory, the results thereof are diagnosed outside the one-chip microcomputer. In other words, in addition to the diagnosis on the test results of the group of logical circuits and the memory, the diagnosis on the test results of the CPU itself can be carried out.

With the above-mentioned arrangement or method, since the problem of an increase in the number of terminals due to the installation of test terminals in a one-chip microcomputer can be solved, it is possible to put the built-in self test into practice even in the case of the one-chip microcomputer, such as IC cards, which have fewer terminals. Moreover, in addition to the diagnosis on the test results of the group of logical circuits and the memory, it is possible to carry out the diagnosis on the test results of the CPU itself, which have been difficult to carry out conventionally.

In order to achieve the above-mentioned problems, the one-chip microcomputer of the present invention is provided with: a CPU; a memory in which a program for controlling operations of the CPU is stored; a group of logical circuits; a self test control circuit for inputting test patterns to the group of logical circuits and the memory and for detecting the respective output signals, in accordance with an instruction from the CPU; a self test activation circuit for setting an initial value for the self test control circuit and for activating the self test control circuit, in accordance with the instruction from the CPU; and a reset circuit which, after the output signals from the CPU, the group of logical circuits and the memory have been detected by the self test control circuit, resets the CPU so as to allow the CPU to execute a program for diagnosing the CPU, the group of logical circuits and the memory based upon the respective output signals.

Moreover, in order to achieve the above-mentioned objective, the control method for a one-chip microcomputer of the present invention, which is a control method for a one-chip microcomputer provided with a CPU, a memory in which a program for controlling operations of the CPU is stored and a group of logical circuits, is provided with the steps of: setting an initial value for a self test control circuit so as to activate the self test control circuit in accordance with an instruction from the CPU (sixth step), allowing the self test control circuit to input test patterns to the CPU, the group of logical circuits and the memory so as to detect the respective output signals in accordance with an instruction from the CPU (seventh step), and after the output signals from the CPU, the group of logical circuits and the memory have been detected by the self test control circuit, resetting the CPU so as to allow the CPU to execute a program for diagnosing the CPU, the group of logical circuits and the memory based upon the respective output signals (eighth step).

With the above-mentioned arrangement or method, a built-in self test is activated in accordance with the instruction from the CPU (the self test activation circuit, the sixth step), and output signals of the CPU, the group of logical circuits and the memory are detected (the self test control circuit, the seventh step). Then, upon completion of the built-in self test, the CPU are reset so that the CPU are allowed to carry out a program for diagnosing the CPU, the group of logical circuits and the memory based upon the respective output signals (the reset circuit, the eighth step).

Consequently, since the activation of the built-in self test and the detection of the output signals are controlled by the CPU built in the one-chip microcomputer, it is possible to carry out the built-in self test without the need for exclusively-used test terminals that have been conventionally required and for complex control externally given.

Moreover, upon completion of the built-in self test, the CPU is reset so that the diagnosis on the test results of the output signals from the CPU, the group of logical circuits and the memory can be carried out inside the one-chip microcomputer. In other words, it is not necessary to externally provide a device for the diagnosis on the test results.

With the above-mentioned arrangement or method, since the problem of an increase in the number of terminals due to the installation of test terminals in a one-chip microcomputer can be solved, it is possible to put the built-in self test into practice even in the case of the one-chip microcomputer, such as IC cards, which have fewer terminals. Here, in addition to the diagnosis on the results of the group of logical circuits and the memory, it is possible to carry out the diagnosis on the results of the CPU itself, which have been difficult to carry out conventionally. Moreover, the diagnosis can be carried out in the one-chip microcomputer itself, without using any external test device.

Moreover, in order to achieve the above-mentioned objective, an IC card of the present invention is equipped with the above-mentioned one-chip microcomputer.

In this arrangement, the one-chip microcomputer, which features that the built-in self test is executed by using a limited number of terminals, is installed in the IC card; therefore, even in the case of IC cards whose number of terminals is limited to eight based upon the standard ISO7816, it is possible to execute a built-in self test.

Moreover, the application of a one-chip microcomputer using a JTAG circuit that conforms to the unified standard IEEE1149.1 as a test circuit makes it possible to execute the built-in self test of the IC card by using a control signal of the JTAG circuit. Since the JTAG circuit is a circuit conforming to the unified standard, it is possible to shorten designing and developing periods for one-chip microcomputers using this circuit, and consequently to shorten the developing period for IC cards using these one-chip microcomputers.

For a fuller understanding of the nature and advantages of the invention, reference should be made to the ensuing detailed description taken in conjunction with the accompanying drawings.

BRIEF DESCRIPTION OF THE DRAWINGS

FIG. 5 is a block diagram that schematically shows the construction of a one-chip microcomputer in accordance with still another embodiment of the present invention.

DESCRIPTION OF THE EMBODIMENTS

Embodiment 1

Figure 1:
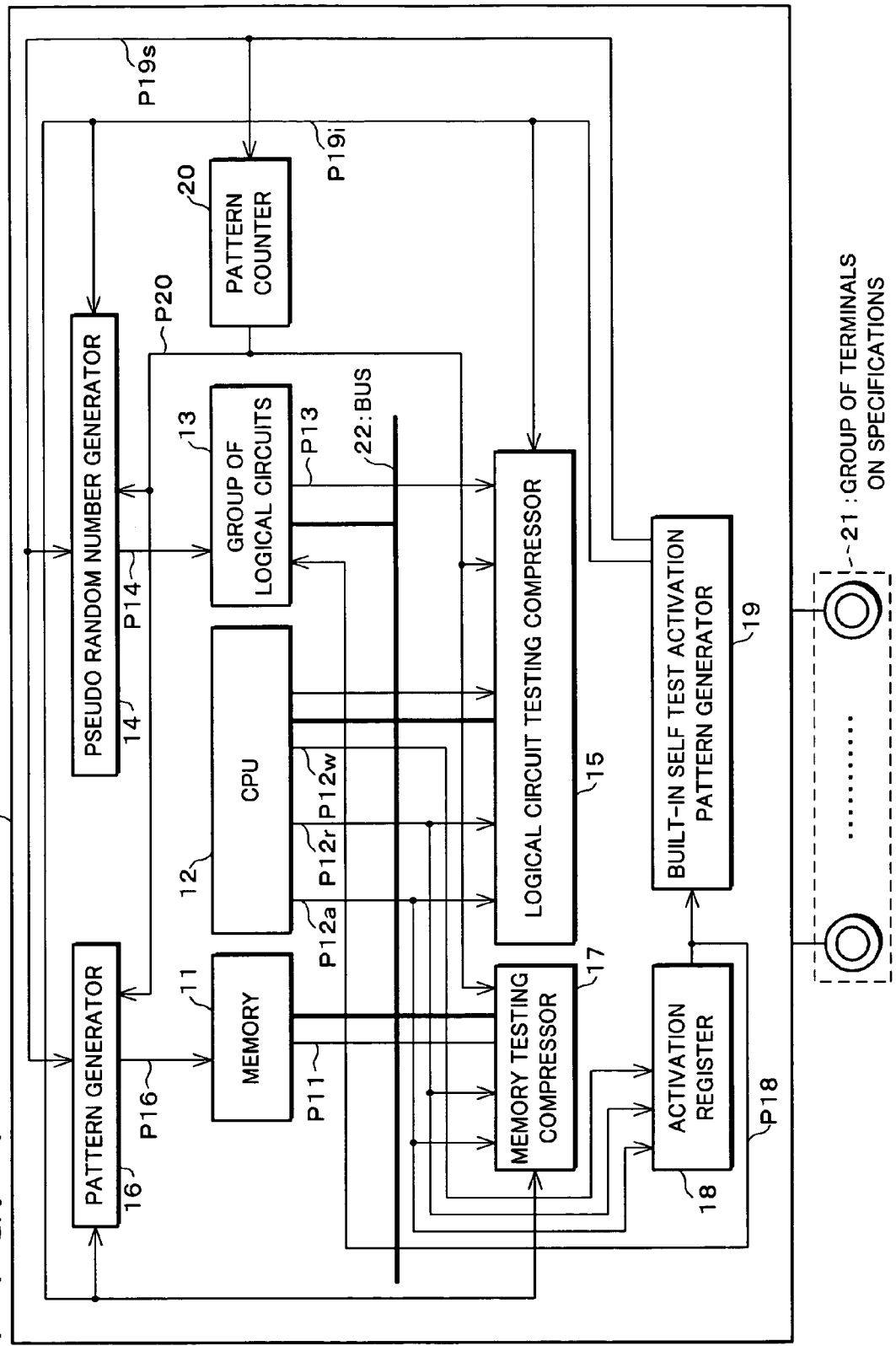
FIG. 1 is a block diagram that schematically shows the construction of a one-chip microcomputer in accordance with one embodiment of the present invention.
Figure 2:
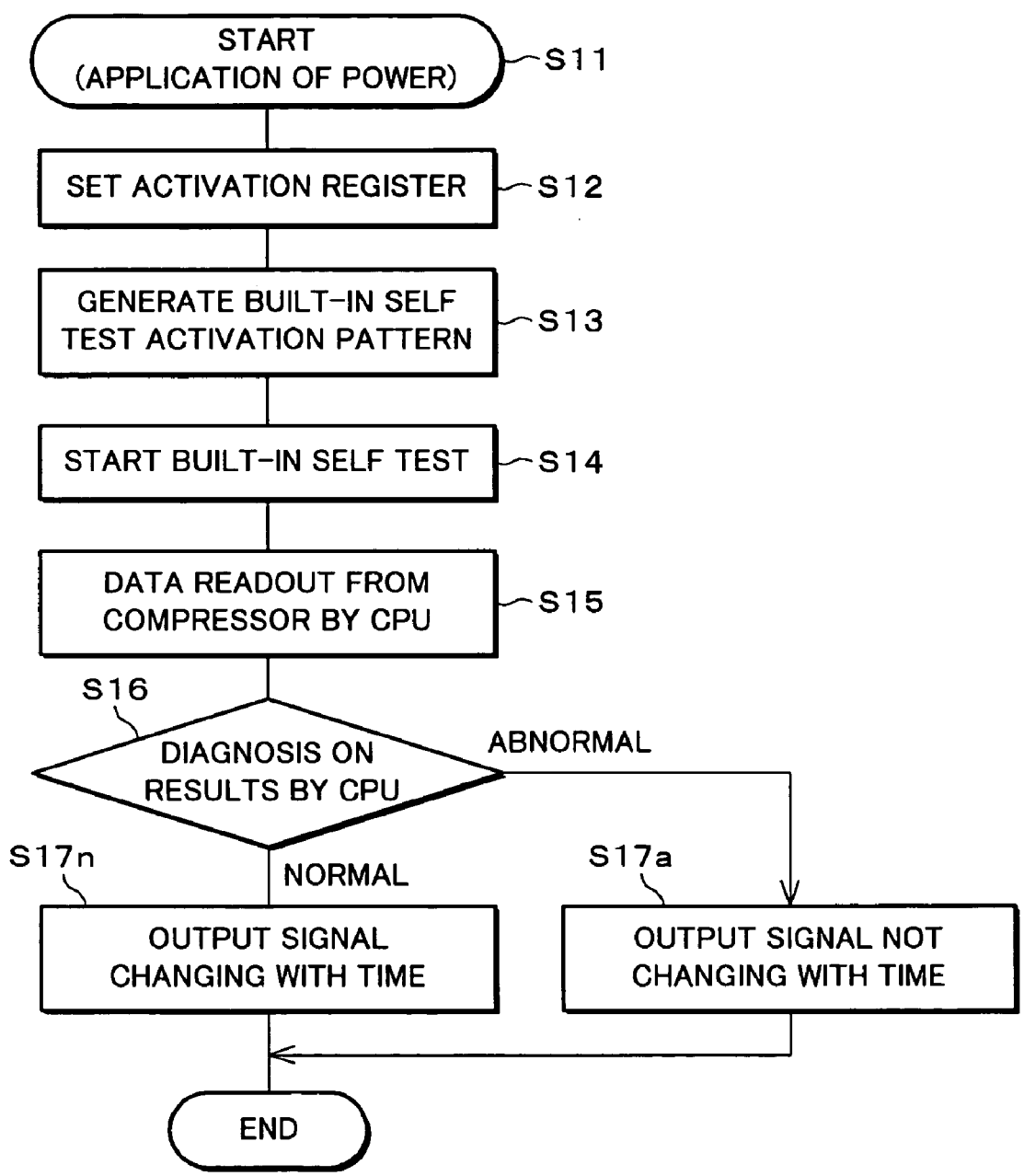
FIG. 2 is a flow chart that shows the operation of the one-chip microcomputer shown in FIG. 1.

Referring to FIGS. 1 and 2, the following description will discuss one embodiment of the present invention.

The one-chip microcomputer of the present invention is provided with a CPU (Central Processing Unit) (Built-in CPU), a memory in which a program for controlling the operation of the CPU is stored and a group of logical circuits, all of which are connected with each other through buses, thereby forming a logical LSI (Large Scale Integrated Circuit) having a built-in self test (BIST: built-in self test) function. Here, the one-chip microcomputer is provided with an activation register for activating a self test control circuit for executing the built-in self test function and a built-in self test activation pattern generator for setting an initial value in the self test control circuit; thus, the CPU is allowed to control the built-in self test on the memory and the group of logical circuits.

In other words, the one-chip microcomputer of the present embodiment carries out a scan test on the memory and the group of logical circuits. Here, the one-chip microcomputer does not carry out a scan test on the CPU. The reason is because the CPU needs to diagnose the memory and the group of logical circuits based upon the results of the scan tests on the memory and the group of logical circuits, and if the CPU carries out a scan test on itself, it is not allowed to carry out these diagnoses.

As illustrated in FIG. 1, the one-chip microcomputer 10 of the present embodiment is constituted by a memory 11, a CPU 12, a group of logical circuits 13, a pseudo random number generator 14, a logical circuit testing compressor 15, a pattern counter 20, a pattern generator 16, a memory testing compressor 17, an activation register 18, a built-in self test activation pattern generator 19 and a group of terminals 21 on specifications. Here, the above-mentioned memory 11, CPU 12, group of logical circuits 13, activation register 18, logical circuit testing compressor 15, and memory testing compressor 17 are connected to each other through buses 22.

Here, the pseudo random number generator 14, the logical circuit testing compressor 15, the pattern generator 16, the memory testing compressor 17 and the pattern counter 20 correspond to the self test control circuit. Moreover, the activation register 18 and the built-in self test activation pattern generator 19 correspond to the self test activation circuit.

The above-mentioned memory 11, CPU 12, group of logical circuits 13, pseudo random number generator 14, memory testing compressor 15, pattern counter 20, pattern generator 16, memory testing compressor 17 and group of terminals 21 on specifications have the same arrangements and functions as those explained in the aforementioned description of the prior art.

In other words, the memory 11 stores a program for controlling the operation of the CPU 12.

The group of logical circuits 13 is constituted by circuits that realize specified operations of the one-chip microcomputer 10. The group of logical circuits 13 include, for example, timers and serial communication control circuits. The timer is a circuit for controlling the time of the program. The serial communication control circuit is an interface for exchanging data with external devices.

The pseudo random number generator 14 generates random numbers as test patterns used for testing the CPU 12 and the group of logical circuits 13, and is provided as, for example, a linear feedback shift register constituted by shift registers with feedbacks.

The logical circuit testing compressor 15 compresses values (signals) that are released from the CPU 12 and the group of logical circuits 13 on demand during the testing process, and is provided as, for example, the linear feedback shift register.

The pattern counter 20, which monitors the execution of the built-in self testing process, is constituted by counter circuits. The pattern counter 20 controls the completion of the operations of the pseudo random number generator 14, the logical circuit testing compressor 15, the pattern generator 16 and the memory testing compressor 17.

The above-mentioned pattern generator 16 generates test patterns for testing the memory 11.

The memory testing compressor 17 compresses values (signals) that are released from the memory 11 on demand during the testing process, and is provided as, for example, the linear feedback shift register.

The group of terminals 21 having the above-mentioned specification is provided with input terminals, output terminals and input-output terminals based upon the specification of the one-chip microcomputer 10.

Moreover, the above-mentioned activation register 18 is placed inside the address space of the one-chip microcomputer 10 so as to activate the test operation of the built-in self test function, and constituted by latch circuits.

The above-mentioned built-in self test activation pattern generator 19, which generates patterns serving as initial values and sets these at the pseudo random number generator 14 serving as the self test control circuit (test control circuit), the logical circuit testing compressor 15, the pattern generator 16 and the memory testing compressor 17, is constituted by counter circuits.

Next, referring to a flow chart shown in FIG. 2, an explanation will be given of the operation of the built-in self test of the one-chip microcomputer 10.

At step S11, upon application of power thereto, the one-chip microcomputer 10 is initialized so that the CPU 12 starts the operation in accordance with the program stored in the memory 11 so as to control the operation of the CPU 12.

At step S12 (first process), in order to activate a built-in self test, the CPU 12 outputs an address signal P12a and a writing signal P12w (writing data signal) to the activation register 18 through the bus 22, thereby setting the data contents of the activation register 18 to data "1".

At step S13 (first process), since the data contents of the activation register 18 has been set to data "1", the activation register 18 outputs an activation setting signal P18 to the built-in self test activation pattern generator 19. Thus, the built-in self test activation pattern generator 19 outputs initial value setting signals P19i (initial values) to the pseudo random number generator 14, the logical circuit testing compressor 15, the pattern generator 16 and the memory testing compressor 17 so as to set them at predetermined initial values. Simultaneously, an activation setting signal P18 is also inputted to the group of logical circuits 13 so that the group of logical circuits 13 is ready for a scan test.

At step S14 (second process), the built-in self test activation pattern generator 19 outputs test start signals P19s to the pseudo random number generator 14, the pattern generator 16 and the pattern counter 20 so that the operation of the built-in self test is started.

In the same manner as the conventional devices, when the operation of the built-in self test is started, a test pattern signal P14 (test pattern), generated by the pseudo random number generator 14, is inputted to the group of logical circuits 13 which are ready for a scan test as a test pattern, and a data signal P13 (output signal), outputted from the group of logical circuits 13, is compressed by the logical circuit testing compressor 15 so that the resulting value forms the result of the built-in self test of the group of logical circuits 13.

Simultaneously, a test pattern signal P16 (test pattern), generated by the pattern generator 16, is inputted to the memory 11 which is ready for a scan test as a test pattern, and a data signal P11 (output signal), outputted from the memory 11, is compressed by the memory testing compressor 17 so that the resulting value forms the result of the built-in self test of the memory 11.

At step S15 (second process), upon completion of the built-in self test, a test completion signal P20 is inputted to the logical circuit testing compressor 15 and the memory testing compressor 17 from the pattern counter 20 so that the operations of the logical circuit testing compressor 15 and the memory testing compressor 17 are stopped. At this time, the result of the test of the group of logical circuits 13 is stored in the logical circuit testing compressor 15 and the result of the test of the memory 11 is stored in the memory testing compressor 17, respectively. Simultaneously with these, the test completion signal P20 is also inputted to the pattern generator 16 and the pseudo random number generator 14 so that the operations of these devices are stopped.

Moreover, the CPU 12, connected to the bus 22, outputs an address signal P12a and a readout signal P12r to the logical circuit testing compressor 15 and the memory testing compressor 17 that are placed inside the address space of the one-chip microcomputer 10, and reads out the values stored in the logical circuit testing compressor 15 and the memory testing compressor 17 through the bus 22.

At step S16, the CPU 12 compares the value of the logical circuit testing compressor 15 and the value of the memory testing compressor 17 thus read out with expected values stored in the memory 11, and diagnoses the results, respectively. In this case, the value of the logical circuit testing compressor 15 and the value of the memory testing compressor 17 may be outwardly outputted outside the one-chip microcomputer 10 through a serial communication so as to compare them with expected values and diagnose the results outside the one-chip microcomputer 10.

At steps S17n and S17a, after the lapse of time required for the built-in self test, the results of diagnosis at the step S16 are outputted by using one terminal among the group of terminals 21 on specifications, and by monitoring this terminal from the outside of the one-chip microcomputer 10 it is possible to confirm whether or not any failure exists.

For example, if the diagnosis at step S16 shows that no failure exists, a signal varying with time is outputted to the terminal currently outputting the results of the diagnosis (Sl7n). In contrast, if the diagnosis at step S16 shows that any abnormality, that is, any failure, exists, a signal not varying with time is outputted to the terminal currently outputting the results of the diagnosis (Sl7a).

In the present embodiment, discrimination on normal/abnormal is carried out based on a state of the terminal under the control of the CPU. Here, it is possible to carry out the discrimination on normal/abnormal by using methods other than the above-mentioned method. For example, in a manner reversed to the above-mentioned method, a signal varying with time may be outputted in the case of an abnormal state, while a signal not varying with time may be outputted in the case of a normal state. However, since there is a possibility that a failure might prevent the signal varying with time from being outputted, it is more preferable to adopt the method for "outputting a signal varying with time in the case of a normal state".

As described above, the one-chip microcomputer of the present embodiment is provided with the built-in self test function, and has the means for activating the testing operation and the pattern generation means for setting an initial value at the test control circuit.

With this arrangement, the built-in self test is activated by an instruction from the built-in CPU, and upon completion of the built-in self test, the results of the test are compared with expected values inside the one-chip microcomputer under an instruction from the built-in CPU; thus, the built-in CPU is allowed to control the activation and the diagnosis on the results of the scan tests on the memory and the group of logical circuits.

Embodiment 2

Figure 3:
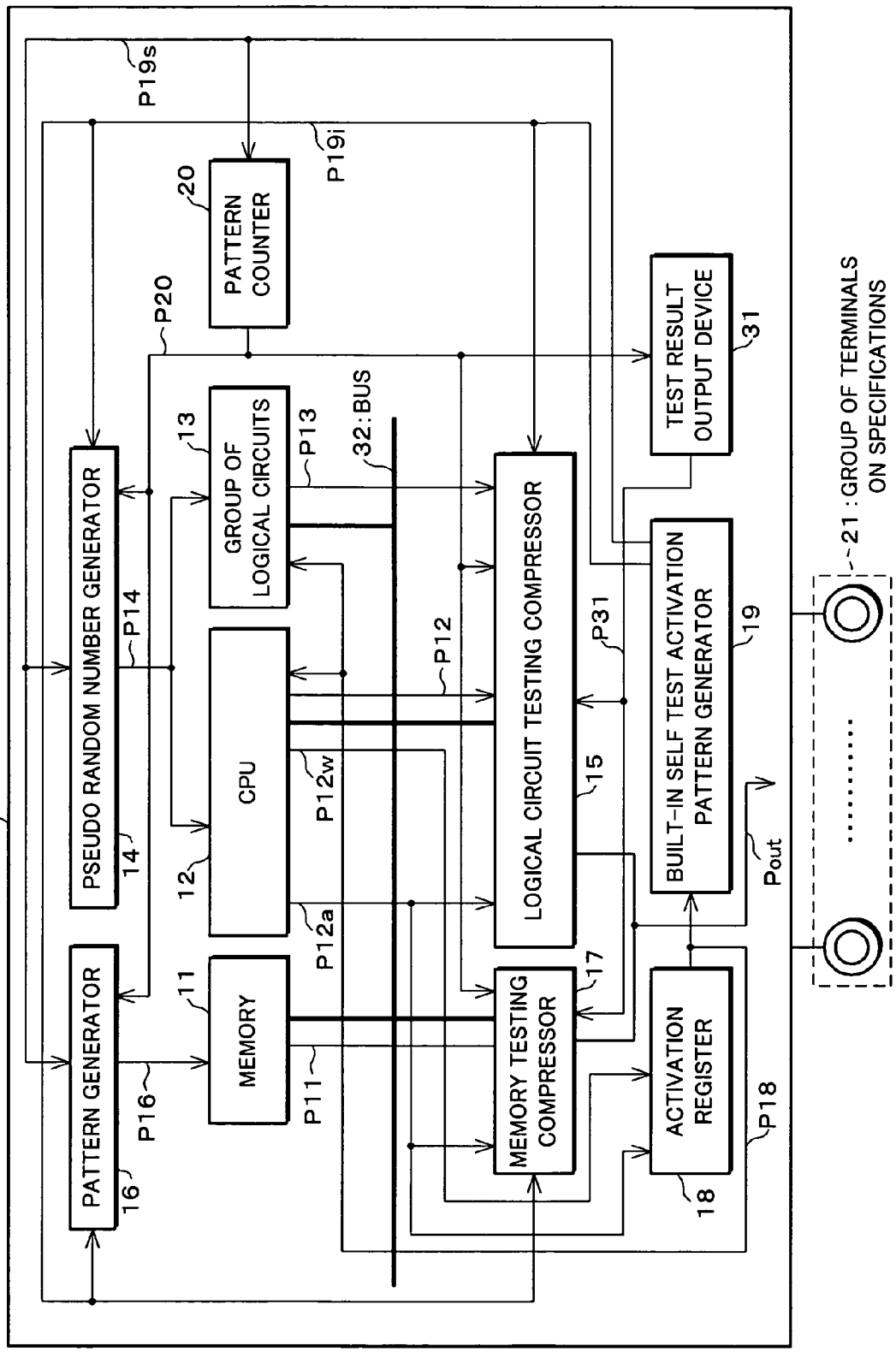
FIG. 3 is a block diagram that schematically shows the construction of a one-chip microcomputer in accordance with another embodiment of the present invention.
Figure 4:
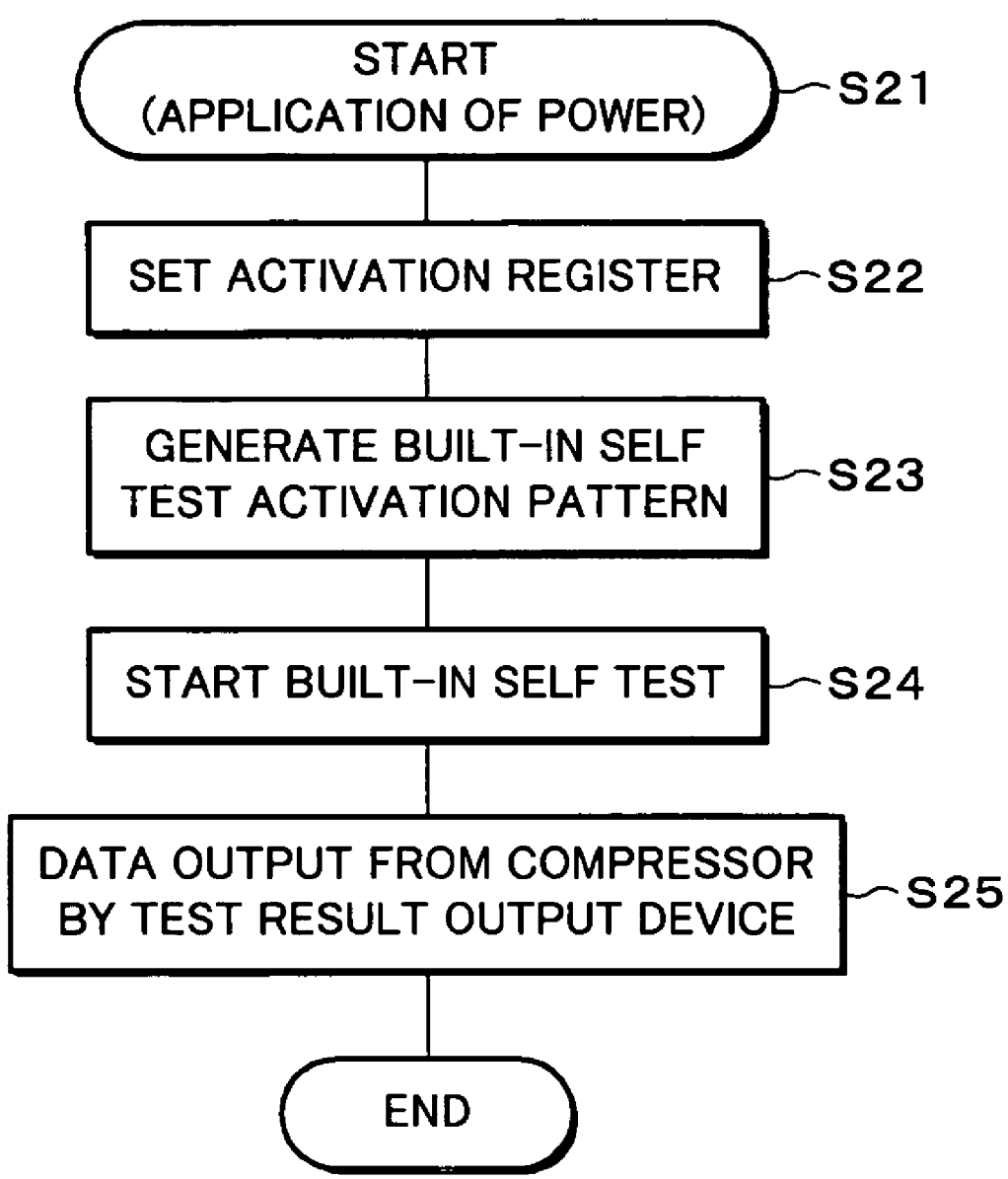
FIG. 4 is a flow chart that shows the operation of the one-chip microcomputer shown in FIG. 3.

Referring to FIGS. 3 and 4, the following description will discuss another embodiment of the present invention. Here, for convenience of explanation, those members that have the same functions and that are described in embodiment 1 are indicated by the same reference numerals and the description thereof is omitted.

The one-chip microcomputer of the present embodiment makes it possible to carry out a scan test on the CPU itself which is not available in the one-chip microcomputer in accordance with embodiment 1.

In the one-chip microcomputer of the aforementioned embodiment 1, when the scan test is carried out on the CPU itself, the following problems arise: (1) The CPU is not allowed to diagnose the test of the memory, (2) it is not allowed to diagnose the scan test of the group of logical circuits, and (3) it is not allowed to diagnose the scan test of the CPU itself. Here, the one-chip microcomputer in accordance with the present embodiment is a test result output device which, upon completion of a built-in self test, outwardly outputs the results of the test so as to carry out the diagnosis outside the one-chip microcomputer. With this arrangement, in the one-chip microcomputer of the present embodiment, the built-in CPU for controlling the built-in self tests on the group of logical circuits and memory is also made a target of the built-in self test.

As illustrated in FIG. 3, the one-chip microcomputer 30 of the present embodiment is constituted by a memory 11, a CPU 12, a group of logical circuits 13, a pseudo random number generator 14, a logical circuit testing compressor 15, a pattern counter 20, a pattern generator 16, a memory testing compressor 17, an activation register 18, a built-in self test activation pattern generator 19 and a group of terminals 21 on specifications, and in addition to these, is also provided with a test result output device (test result output circuit) 31. Here, the above-mentioned memory 11, CPU 12, group of logical circuits 13 and activation register 18 are connected to each other through buses 32.

Here, the memory 11, the CPU 12, the group of logical circuits 13, the pseudo random number generator 14, the logical circuit testing compressor 15, the pattern counter 20, the pattern generator 16, the memory testing compressor 17, the activation register 18, the built-in self test activation pattern generator 19 and the group of terminals on specifications 21 have the same arrangements and functions as those described in embodiment 1.

Upon completion of the built-in self test, the test result output device 31 generates a control signal for outputting the values of the logical circuit testing compressor 15 and the memory testing compressor 17 outside the one-chip microcomputer as the results of the tests, and this is provided with a counter circuit.

Next, referring to a flow chart shown in FIG. 4, an explanation will be given of the operation of the built-in self test of the one-chip microcomputer 30.

At step S21, upon application of power thereto, the one-chip microcomputer 30 is initialized so that the CPU 12 starts the operation in accordance with the program for controlling the operation of the CPU 12 stored in the memory 11.

At step S22 (third process), in order to activate a built-in self test, the CPU 12 outputs an address signal P12a and a writing signal P12w (writing data signal) to the activation register 18 that is placed inside an address space of the one-chip microcomputer 30 and connected thereto through the bus 32, thereby setting the data contents of the activation register 18 to data "1".

At step S23 (third process), since the data contents of the activation register 18 has been set to data "1", the activation register 18 outputs an activation setting signal P18 to the built-in self test activation pattern generator 19. Thus, the built-in self test activation pattern generator 19 outputs initial value setting signals P19i to the pseudo random number generator 14, the logical circuit testing compressor 15, the pattern generator 16 and the memory testing compressor 17 so as to set them at predetermined initial values. Simultaneously, an activation setting signal P18 is also inputted to the CPU 12 and the group of logical circuits 13 so that the CPU 12 and the group of logical circuits 13 are ready for a scan test.

At step S24 (fourth process), the built-in self test activation pattern generator 19 outputs test start signals Pl9s to the pseudo random number generator 14, the pattern generator 16 and the pattern counter 20 so that the operation of the built-in self test is started.

In the same manner as the conventional devices, when the operation of the built-in self test is started, a test pattern signal P14, generated by the pseudo random number generator 14, is inputted to the CPU 12 and the group of logical circuits 13 which are ready for a scan test as a test pattern, and a data signal P12 (output signal) and a data signal P13, outputted from the CPU 12 and the group of logical circuits 13, are compressed by the logical circuit testing compressor 15 so that the resulting values form the results of the built-in self tests of the CPU 12 and the group of logical circuit groups 13.

Simultaneously, a test pattern signal P16, generated by the pattern generator 16, is inputted to the memory 11 which is ready for a scan test as a test pattern, and a data signal P11, outputted from the memory 11, is compressed by the memory testing compressor 17 so that the resulting value forms the result of the built-in self test of the memory 11.

At step S25 (fifth process), upon completion of the built-in self test, a test completion signal P20 is inputted to the logical circuit testing compressor 15 and the memory testing compressor 17 from the pattern counter 20 so that the operations of the logical circuit testing compressor 15 and the memory testing compressor 17 are stopped. At this time, the results of the tests of the CPU 12 and the group of logical circuits 13 are stored in the logical circuit testing compressor 15 and the result of the test of the memory 11 is stored in the memory testing compressor 17, respectively. Simultaneously with these, the test completion signal P20 is also inputted to the pattern generator 16 and the pseudo random number generator 14 so that the operations of these devices are stopped.

Simultaneously with this, the test completion signal P20 is also inputted to the test-result output device 31. Upon receipt of the test completion signal P20, the test-result output device 31 inputs an output clock signal P31 having a clock cycle to the logical circuit testing compressor 15 and the memory testing compressor 17. Thus, in the same manner as the explanation in the prior art description, the logical circuit testing compressor 15 and the memory testing compressor 17, constituted like shift registers, successively output an output data signal Pout (output signal) with 1 bit to an output line each time one cycle of the output clock signal P31 is inputted. Here, the output line may be connected to one of the group of terminals 21 on specifications. After a lapse of time required for the built-in self test, the output data signal Pout is compared with an expected value so that a judgment is made as to whether or not any failure exists.

As described above, the one-chip microcomputer of the present embodiment is provided with the built-in self test function, and has the means for activating the testing operation, the pattern generation means for setting an initial value at the test control circuit and the test result output means for outputting the result of the built-in self test outside the one-chip microcomputer.

With this arrangement, the built-in self test is activated by an instruction from the built-in CPU, and upon completion of the built-in self test, the results of the test are outputted outside the one-chip microcomputer, and compared with expected values outside the one-chip microcomputer; thus, the built-in CPU is made a target for the built-in self test.

Embodiment 3

Figure 6:
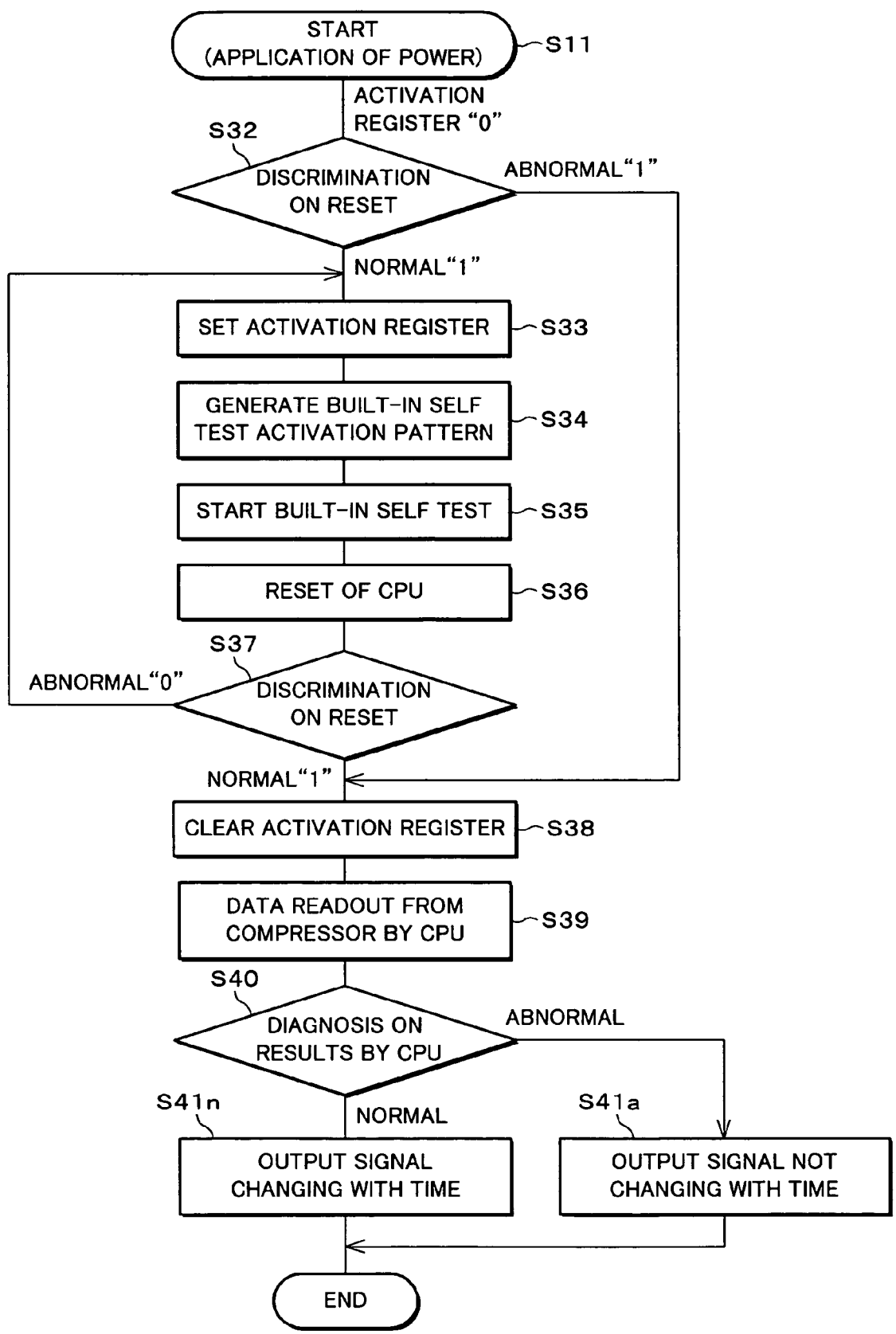
FIG. 6 is a flow chart that shows the operation of the one-chip microcomputer shown in FIG. 5.

Referring to FIGS. 5 and 6, the following description will discuss another embodiment of the present invention. Here, for convenience of explanation, those members that have the same functions and that are described in embodiment 1 are indicated by the same reference numerals and the description thereof is omitted.

The one-chip microcomputer of embodiment 2 carries out the diagnosis outside so as to make it possible to carry out a scan test on the CPU itself. In contrast, the one-chip microcomputer of the present embodiment also makes it possible to carry out the scan test on the CPU itself, and the CPU is also allowed to diagnose the results of the test.

More specifically, the one-chip microcomputer of the present embodiment is provided with a reset generator for initializing the built-in CPU, and upon completion of the built-in self test, the built-in CPU is reset so that the CPU is again allowed to operate in accordance with the program stored in the memory. With this arrangement, after the results of the scan tests on the memory, the group of logical circuits and the CPU have been stored in the memory built in the logical circuit testing compressor 15 and the memory testing compressor 17, the CPU is reset by the reset generator so that it becomes possible to carry out a diagnosis on the CPU itself.

As illustrated in FIG. 5, the one-chip microcomputer 50 of the present embodiment is constituted by a memory 11, a CPU 12, a group of logical circuits 13, a pseudo random number generator 14, a logical circuit testing compressor 15, a pattern counter 20, a pattern generator 16, a memory testing compressor 17, an activation register 18, a built-in self test activation pattern generator 19 and a group of terminals 21 on specifications, and in addition to these, is also provided with a reset generator (reset circuit) 51. Here, the above-mentioned memory 11, CPU 12, group of logical circuits 13, activation register 18, logical circuit testing compressor 15 and memory testing compressor 17 are connected to each other through buses 52.

Here, the memory 11, the CPU 12, the group of logical circuits 13, the pseudo random number generator 14, the logical circuit testing compressor 15, the pattern counter 20, the pattern generator 16, the memory testing compressor 17, the activation register 18, the built-in self test activation pattern generator 19 and the group of terminals on specifications 21 have the same arrangements and functions as those described in embodiment 1.

Upon completion of the built-in self test, the reset generator 51 generates a signal for initializing the CPU 12.

Next, referring to a flow chart shown in FIG. 6, an explanation will be given of the operation of the built-in self test of the one-chip microcomputer 50.

At step S31, upon application of power thereto, the one-chip microcomputer 50 is initialized so that the CPU 12 starts the operation in accordance with the program for controlling the operation of the CPU 12 stored in the memory 11.

At step S32, the CPU 12 outputs an address signal P12a and an address signal P12a and a read out signal P12r to the activation register 18 that is placed inside an address space of the one-chip microcomputer 50 and connected thereto through the bus 52, thereby confirming the contents of the activation register 18. The contents of the activation register 18 has been initialized to data "0" at step S31, and the CPU 12 confirms that the activation register 18 has data "0" and recognizes that the initialization was made at the time of power application. Then, if the activation register 18 has data "zero" (normal), the sequence proceeds to step S33. In contrast, if the activation register 18 has data "1" (abnormal), the sequence proceeds to step S38.

At step S33 (sixth process), in order to activate a built-in self test, the CPU 12 outputs an address signal P12a and a writing signal P12w (writing data signal) to the activation register 18 that is placed inside an address space of the one-chip microcomputer 50 and connected thereto through the bus 52, thereby setting the data contents of the activation register 18 to data "1".

At step S34 (sixth process), since the data contents of the activation register 18 has been set to data "1", the activation register 18 outputs an activation setting signal P18 to the built-in self test activation pattern generator 19. Thus, the built-in self test activation pattern generator 19 outputs initial value setting signals P19i to the pseudo random number generator 14, the logical circuit testing compressor 15, the pattern generator 16 and the memory testing compressor 17 so as to set them at predetermined initial values. Simultaneously, an activation setting signal P18 is also inputted to the CPU 12 and the group of logical circuits 13 so that the CPU 12 and the group of logical circuits 13 are ready for a scan test.

At step S35 (seventh process), the built-in self test activation pattern generator 19 outputs test start signals P19s to the pseudo random number generator 14, the pattern generator 16 and the pattern counter 20 so that the operation of the built-in self test is started.

In the same manner as the conventional devices, when the operation of the built-in self test is started, a test pattern signal P14, generated by the pseudo random number generator 14, is inputted to the CPU 12 and the group of logical circuits 13 which are ready for a scan test as a test pattern, and a data signal P13, outputted from the CPU 12 and the group of logical circuits 13, are compressed by the logical circuit testing compressor 15 so that the resulting value forms the results of the built-in self tests of the CPU 12 and the group of logical circuit groups 13.

Simultaneously, the pattern generator 16 inputs a test pattern signal P16 to the memory 11, and a data signal P11, outputted from the memory 11, is compressed by the memory testing compressor 17 so that the resulting value forms the result of the built-in self test of the memory 11.

At step S36 (eighth process), upon completion of the built-in self test, a test completion signal P20 is inputted to the logical circuit testing compressor 15 and the memory testing compressor 17 from the pattern counter 20 so that the operations of the logical circuit testing compressor 15 and the memory testing compressor 17 are stopped. At this time, the results of the tests of the CPU 12 and the group of logical circuits 13 are stored in the logical circuit testing compressor 15 and the result of the test of the memory 11 is stored in the memory testing compressor 17, respectively. Simultaneously with these, the test completion signal P20 is also inputted to the pattern generator 16 and the pseudo random number generator 14 so that the operations of these devices are stopped.

Simultaneously with this, the test completion signal P20 is also inputted to the reset generator 51. Upon receipt of the test completion signal P20, the reset generator 51 outputs a reset signal P51 to the CPU 12 so as to initialize the CPU 12.

At step S37 (eighth process), the CPU 12 is initialized so that it is allowed to return to the state where it is operative in accordance with the program stored in the memory 11 from the state where it is the target of the scan test, and allowed to resume the operation. The CPU 12 inputs an address signal P12a and a readout signal P12r to the activation register 18 so that it confirms that the activation register 18 has data "1" and recognizes that the initialization was not made at the time of power application, but made by the resetting of the reset generator 51 upon completion of the built-in self test.

At step S38 (eighth step), the CPU 12 inputs an address signal P12a and a writing signal P12w (writing data signal) to the activation register 18 through the bus 52, thereby setting the activation register 18 at data "0".

At step S39 (eighth step), the CPU 12 inputs an address signal P12a and a readout signal P12r to the logical circuit testing compressor 15 and the memory testing compressor 17 which are placed inside an address space of the one-chip microcomputer 50 and connected to each other through the bus 52 in such a manner that the values of the logical circuit testing compressor 15 and the memory testing compressor 17 through the bus 52.

At step S40 (eighth process), the CPU 12 compares the value of the logical circuit testing compressor 15 and the value of the memory testing compressor 17 thus read out with expected values preliminarily stored in the memory 11, and diagnoses the results of the comparison. In this case, for example, the value of the logical circuit testing compressor 15 and the value of the memory testing compressor 17 may be outwardly outputted from the one-chip microcomputer 50 by means of serial communication, and may be compared with expected values and the results of comparison may be diagnosed outside the one-chip microcomputer 50.

At steps S41n and S41a, after a lapse of time required for the built-in self test, the results of diagnosis at the step S40 are outputted by using one terminal among the group of terminals 21 on specifications, and by monitoring this terminal from the outside of the one-chip microcomputer 50 it is possible to confirm whether or not any failure exists.

For example, if the diagnosis at step S40 shows "normal", that is, no failure exists, a signal varying with time is outputted to the terminal currently outputting the results of the diagnosis (S41n). In contrast, if the diagnosis at step S40 shows that any abnormality, that is, any failure, exists, a signal not varying with time is outputted to the terminal currently outputting the results of the diagnosis (S41a).

The following description will discuss a case in which there is any abnormality in the resetting operation.

First, in the case when there is a degeneracy failure, which is a failure where the state "1" is always maintained and cannot be changed to "0", in the output (activation setting signal P18) of the activation register 18 in the discrimination (S32) on the resetting immediately after power application, this is discriminated to be abnormal. Then, the sequence proceeds to step S38 without carrying out the processes from step S33 to step S37. Therefore, even if the values of the logical circuit testing compressor 15 and the memory testing compressor 17 are read out at step S39, these values are discriminated to be abnormal in the following step S40, with the result that the signal indicating the normal state (the signal varying with time) is not outputted from the terminal outputting the results of diagnosis; thus, the diagnosis shows the occurrence of any failure.

Second, in the case when there is a degeneracy failure, which is a failure where the state "0" is always maintained and cannot be changed to "1", in the output (activation setting signal P18) of the activation register 18 in the discrimination (S37) on the resetting after completion of the built-in self test, this is discriminated to be abnormal at step S37. Then, the sequence proceeds to step S33, with the result that a loop is formed from step S33 to step S37. Since the step S41 is skipped, the signal indicating the normal state (the signal varying with time) is not outputted from the terminal outputting the results of diagnosis and the signal indicating an abnormal state (the signal not varying with time); thus, the diagnosis shows the occurrence of any failure.

As described above, the one-chip microcomputer of the present embodiment is provided with a built-in self test function, and also has a means for activating a testing operation, a pattern generation means for setting an initial value in the test control circuit and a reset generation means for initializing the built-in CPU after completion of the built-in self test.

With this arrangement, the built-in self test is activated by an instruction from the built-in CPU, and after completion of the built-in self test, the operation is shifted from the circuit construction that has been a target of the built-in self test, and again started in accordance with the memory that stores the program for controlling the operation of the CPU. Therefore, the one-chip microcomputer makes it possible to carry out a scan test on the CPU itself, and the CPU is allowed to diagnose the results of the test.

Embodiment 4

Figure 7:
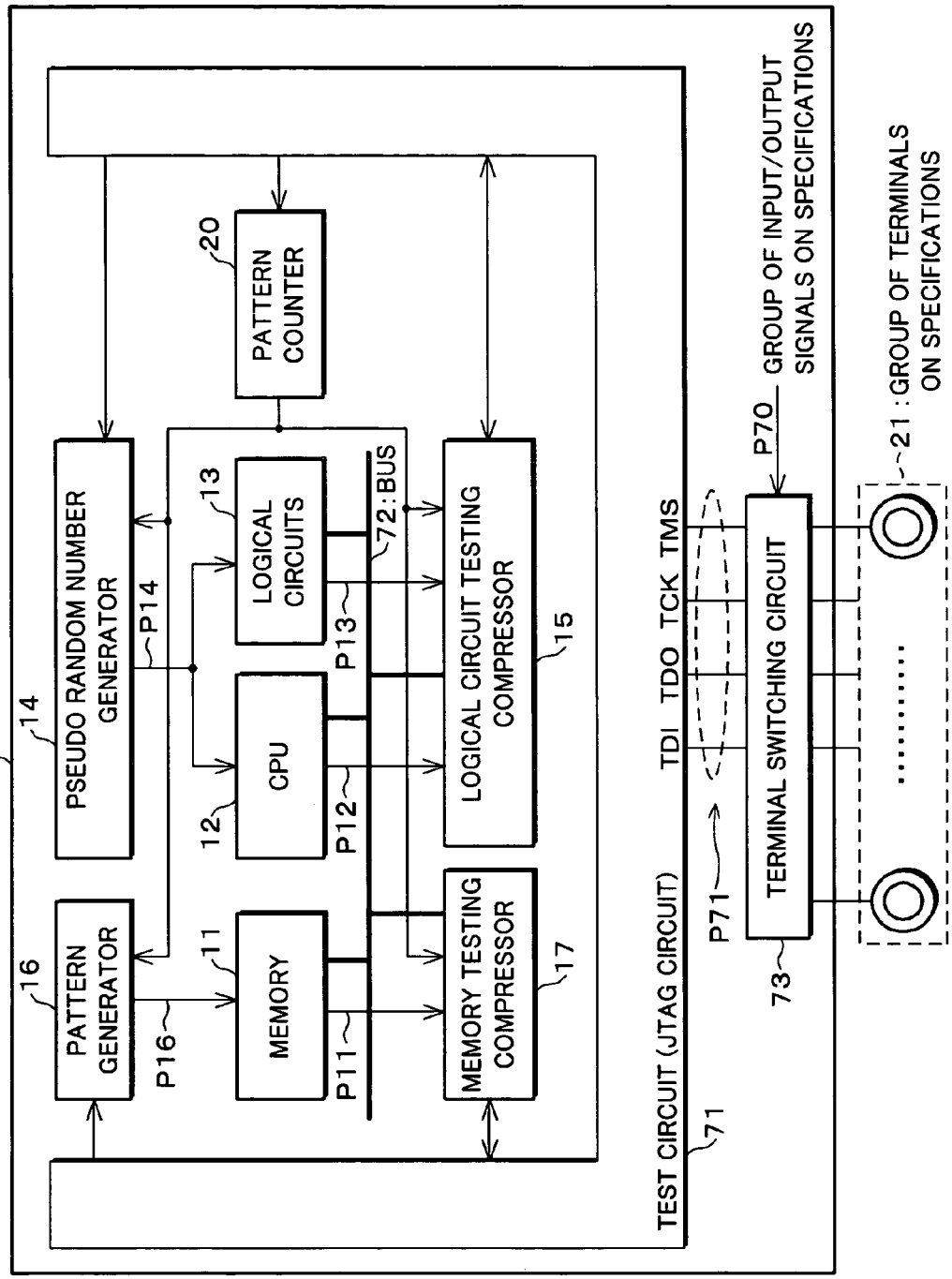
FIG. 7 is a block diagram that schematically shows the construction of still another one-chip microcomputer in accordance with another embodiment of the present invention.
Figure 8:
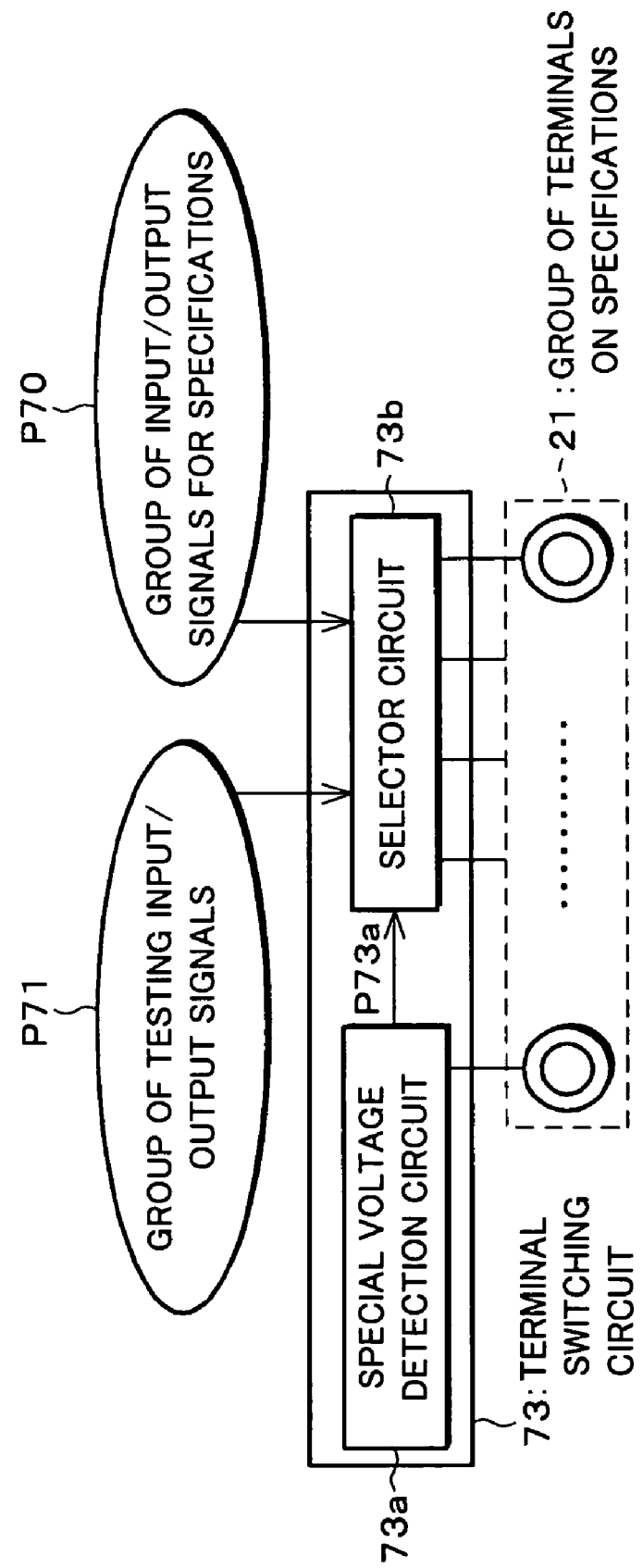
FIG. 8 is a block diagram that schematically shows a construction of a terminal switching circuit installed in the one-chip microcomputer shown in FIG. 7.
Figure 9:
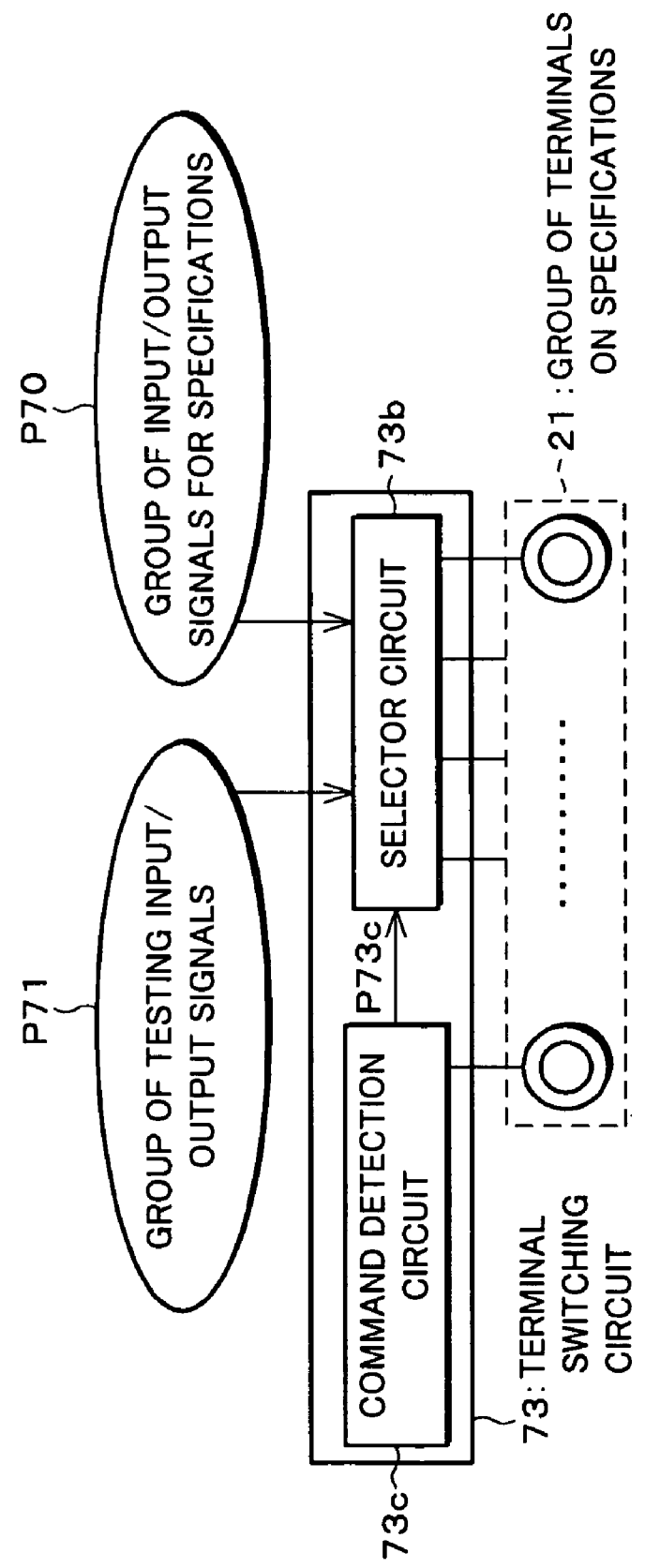
FIG. 9 is a block diagram that schematically shows another construction of a terminal switching circuit installed in the one-chip microcomputer shown in FIG. 7.

Referring to FIGS. 7 through 9, the following description will discuss still another embodiment of the present invention. Here, for convenience of explanation, those members that have the same functions and that are described in embodiments 1 through 3 are indicated by the same reference numerals and the description thereof is omitted.

As illustrated in FIG. 7, the one-chip microcomputer 70 of the present embodiment is constituted by a memory 11, a CPU 12, a group of logical circuits 13, a pseudo random number generator 14, a logical circuit testing compressor 15, a pattern counter 20, a pattern generator 16, a memory testing compressor 17, a test circuit 71, a terminal switching circuit (terminal switching means) 73 and a group of terminals 21 on specifications. Here, the above-mentioned memory 11, CPU 12, group of logical circuits 13, logical circuit testing compressor 15, and memory testing compressor 17 are connected to each other through a bus 72.

The above-mentioned memory 11, CPU 12, group of logical circuits 13, pseudo random number generator 14, memory testing compressor 15, pattern counter 20, pattern generator 16, memory testing compressor 17 and group of terminals 21 on specifications have the same arrangements and functions as those explained in Embodiment 1; therefore, the explanation thereof is omitted.

Moreover, the above-mentioned test circuit 71 is a JTAG circuit conforming to the standard of IEEE 1149.1, and has the same arrangement and functions as those explained in the prior art; therefore, the description thereof is omitted.

Here, the pseudo random number generator 14, logical circuit testing compressor 15, pattern generator 16, memory testing compressor 17 and pattern counter 20 correspond to the self test control circuit. Moreover, the test circuit 71 corresponds to the self test activation circuit.

The terminal switching circuit 73 provides control in such a manner that either a group of testing input/output signals (group of self testing signals) P71 to the test circuit 71 or a group of input/output signals on specifications (group of signals on specifications) P70, is connected to the group of terminals 21 on specifications. Here, the group of input/output signals on specifications P70 refer to a group of signals that are to be connected to the group of terminals 21 on specifications so as to realize normal functions of the one-chip microcomputer 70.

Referring to FIGS. 8 and 9, the following description will discuss two specific constructions of the above-mentioned terminal switching circuit 73.

(1) Construction for Detecting a Signal having a Specific Electrical Potential (Voltage Detection Method)

As shown in FIG. 8, the terminal switching circuit 73 may be constituted by a special voltage detection circuit 73*a* and a selector circuit 73*b*.

The above-mentioned special voltage detection circuit 73*a* detects an input of a signal having a special electrical potential other than operational voltages on specifications, which instructs switching between the groups of signals through a predetermined terminal of the group of terminals 21 on specifications. In other words, upon detection of a signal input having a special electrical potential, the special voltage detection circuit 73*a* changes the data of a special voltage detection signal P73*a* from data "0" to data "1", and transmits the resulting signal to the selector circuit 73*b*.

Here, with respect to the signal having the special electrical potential to be detected by the special voltage detection circuit 73*a*, any signal may be used as long as it enables discrimination from the operations on specifications. Moreover, this signal can be inputted through one or a plurality of terminals of the group of terminals 21 on specifications.

The selector circuit 73*b* to which the group of testing input/output signals P71 and the group of input/output signals on specifications P70 are connected, is also connected to the special voltage detection signal P73*a*. Here, the selector circuit 73*b* connects the group of input/output signal P70 on specifications to the group of terminals 21 on specifications when the data of the special voltage detection signal P73*a* is "0", and connects the group of testing input/output signals P71 of the test circuit 71 to the group of terminals 21 on specifications when the data of the special voltage detection signal P73*a* is changed from "0" to "1". In other words, in accordance with the special voltage detection signal P73*a*, the selector circuit 73*b* switches the signal to be connected to the group of terminals 21 on specifications between the group of input/output signal P70 and the group of testing input/output signals P71, thereby forming an interface.

(2) Construction for Detecting a Command (Command Detection Method)

As illustrated in FIG. 9, the terminal switching circuit 73 may be provided with a command detection circuit 73*c* in place of the above-mentioned special voltage detection circuit 73*a*.

The above-mentioned command detection circuit 73*c* detects an input of a predetermined command which instructs switching between the groups of signals through a predetermined terminal of the group of terminals 21 on specifications. In other words, upon detection of an input of a predetermined command, the command detection circuit 73*c* changes the data of a special voltage detection signal P73*c* from data "0" to data "1", and transmits the resulting signal to the selector circuit 73*a*.

Here, with respect to the command to be detected by the command detection circuit 73*c*, any command may be used as long as it enables discrimination from commands for operations on specifications. Moreover, this command can be inputted through one or a plurality of terminals of the group of terminals 21 on specifications.

The selector circuit 73*b* to which the group of input/output signals on specifications P70 and the group of testing input/output signals P71 of the test circuit 71 are connected, is also connected to the command detection signal P73*c*. Here, the selector circuit 73*b* connects the group of input/output signal P70 on specifications to the group of terminals 21 on specifications when the data of the command detection signal P73*c* is "0", and connects the group of testing input/output signals P71 of the test circuit 71 to the group of terminals 21 on specifications when the data of the command detection signal P73*c* is changed from "0" to "1". In other words, in accordance with the command detection signal P73*c*, the selector circuit 73*b* switches the signal to be connected to the group of terminals 21 on specifications between the group of input/output signal P70 and the group of testing input/output signals P71, thereby forming an interface.

The terminal switching circuit 73 is provided with either of the above-mentioned arrangements so that the test circuit 71 comes to be directly controlled from outside only at the time of testing; therefore, it becomes possible to carry out the built-in self test without the need for any exclusively-used testing terminal.

Here, when the group of testing input/output signals P71 are interfaced from the group of terminals 21 on specifications by the terminal switching circuit 73, TDI signal, TDO signal, TCK signal and TMS signal are inputted and outputted to and from the test circuit 71 from and to the group of terminals 21 on specifications in accordance with the IEEE 1149.1 standard. Consequently, when these signals are inputted and outputted in and from the respective terminals of the group of terminals 21 on specifications, the following operations are carried out so as to execute the built-in self test, as described in the Prior Art term.

In other words, in accordance with an instruction and attached data from the TDI signal sampled by using the TCK signal, the pseudo random number generator 14, the pattern generator 16, the logical circuit testing compressor 15 and the memory testing compressor 17 are set in their initial states, and the built-in self test is activated (the ninth process).

When the built-in self test has been activated, the signal P14 generated by the pseudo random number generator 14 is inputted to the CPU 12 and the group of logical circuits 13 that have come to be operable for a scan test. Then, data signals P12 and P13, outputted from the CPU 12 and the group of logical circuits 13, are compressed by the logical circuit testing compressor 15 so that the resulting value is given as a test result after the built-in self test of the group of logical circuits 13. Simultaneously with this operation, the pattern generator 16 inputs a test pattern signal P16 to the memory 11, and a data signal P11, outputted from the memory 11, is compressed by the memory testing compressor 17 so that the resulting value is given as a test result after the built-in self test of the memory 11 (the tenth process).

Upon completion of the built-in self test, the pattern counter 20 stops the operations of the logical circuit testing compressor 15 and the memory testing compressor 17; thus, in accordance with the instruction and the attached data from the TDI signal sampled from the TCK signal, the test results of the built-in self tests of the CPU 12 and the group of logical circuits 13 and the test result of the built-in self test of the memory 11 are outputted through the terminal assigned to the TDO signal in synchronism with the TCK signal, and compared with expected values outside the one-chip microcomputer 70 so as to make judgments.

At this time, the one-chip microcomputer 70 carries out a process for switching the group of signals passing through the group of terminals 21 on specifications by using the terminal switching circuit 73 so that the group of testing input/output signals P71 are inputted and outputted at the time of the self tests, while the group of input/output signals P70 on specifications are inputted and outputted at the time of normal use (the 11th process).

As described above, since the terminal switching circuit 73 for switching the group of signals is installed in one-chip microcomputer 70, no terminals for self tests need to be added to the group of terminals on specifications. Therefore, it is possible to carry out the built-in self test by using a standardized construction conforming to the IEEE 1149.1 standard, without an increase in the number of terminals.

Moreover, since the built-in self test can be externally activated by using a control signal of the test circuit 71 (JTAG circuit), and since the results can be diagnosed externally, it is possible to carry out a scan test on the CPU 12 itself and also to diagnose the results thereof.

Here, since the test circuit 71 is a standardized circuit conforming to a specific standard, the application of this circuit makes it possible to shorten designing and developing periods of one-chip microcomputers.

Embodiment 5

Figure 10:
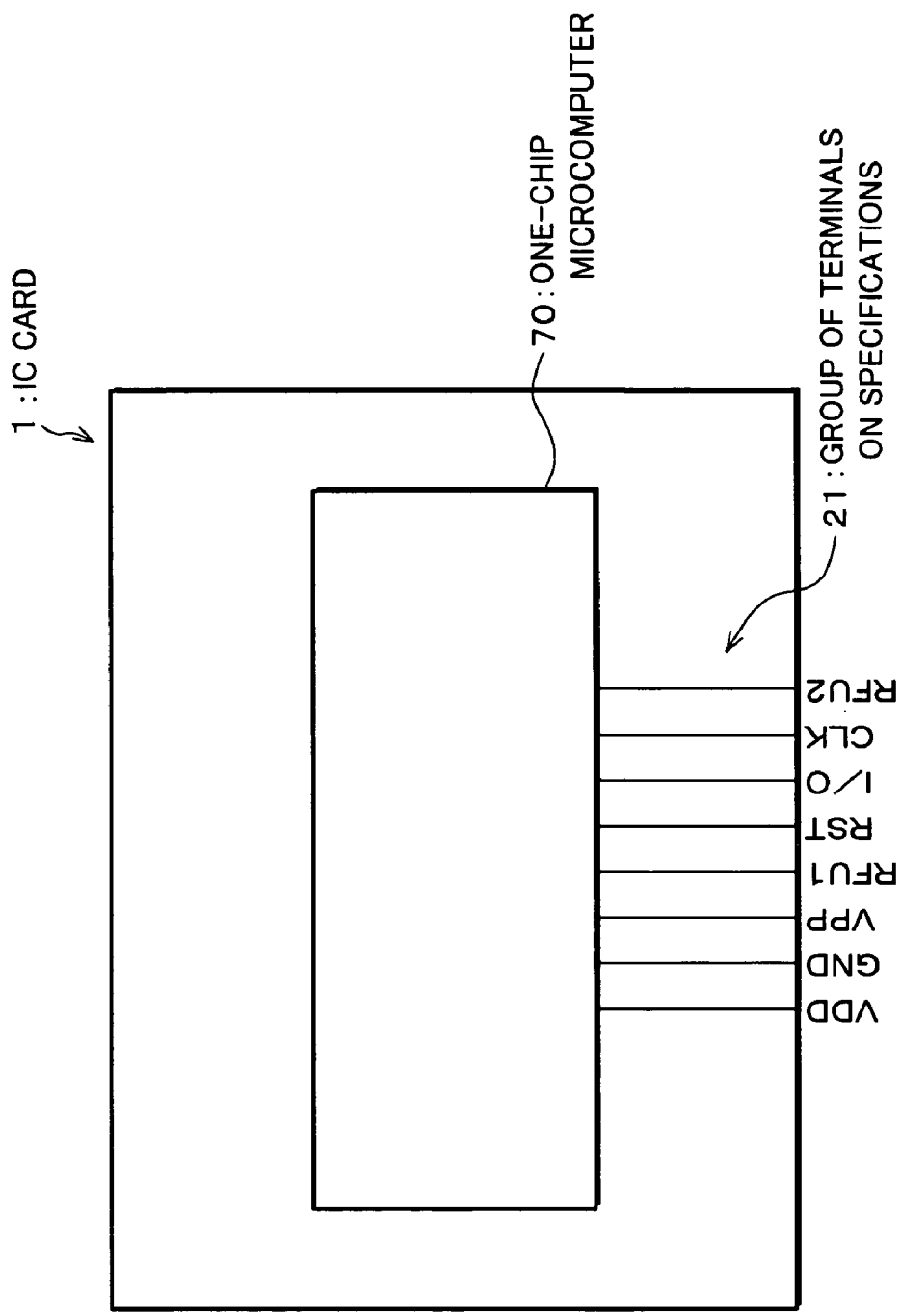
FIG. 10 is a block diagram which schematically shows an IC card in accordance with still another embodiment of the present invention and also shows a state in which it is actually used.
Figure 11:
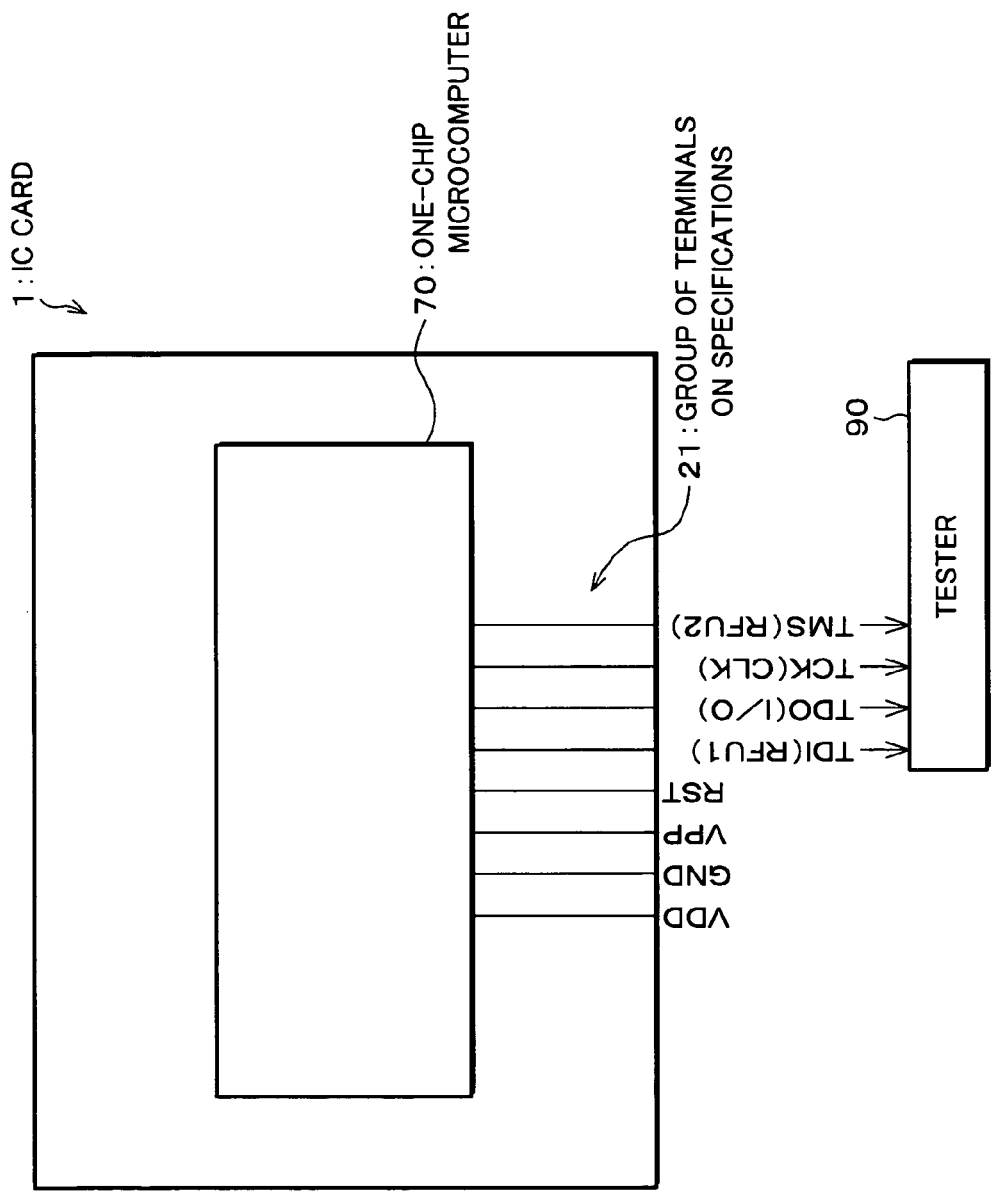
FIG. 11 is a block diagram that shows a state in which a built-in self test is carried out on the one-chip microcomputer of the IC card shown in FIG. 10.
Figure 12:
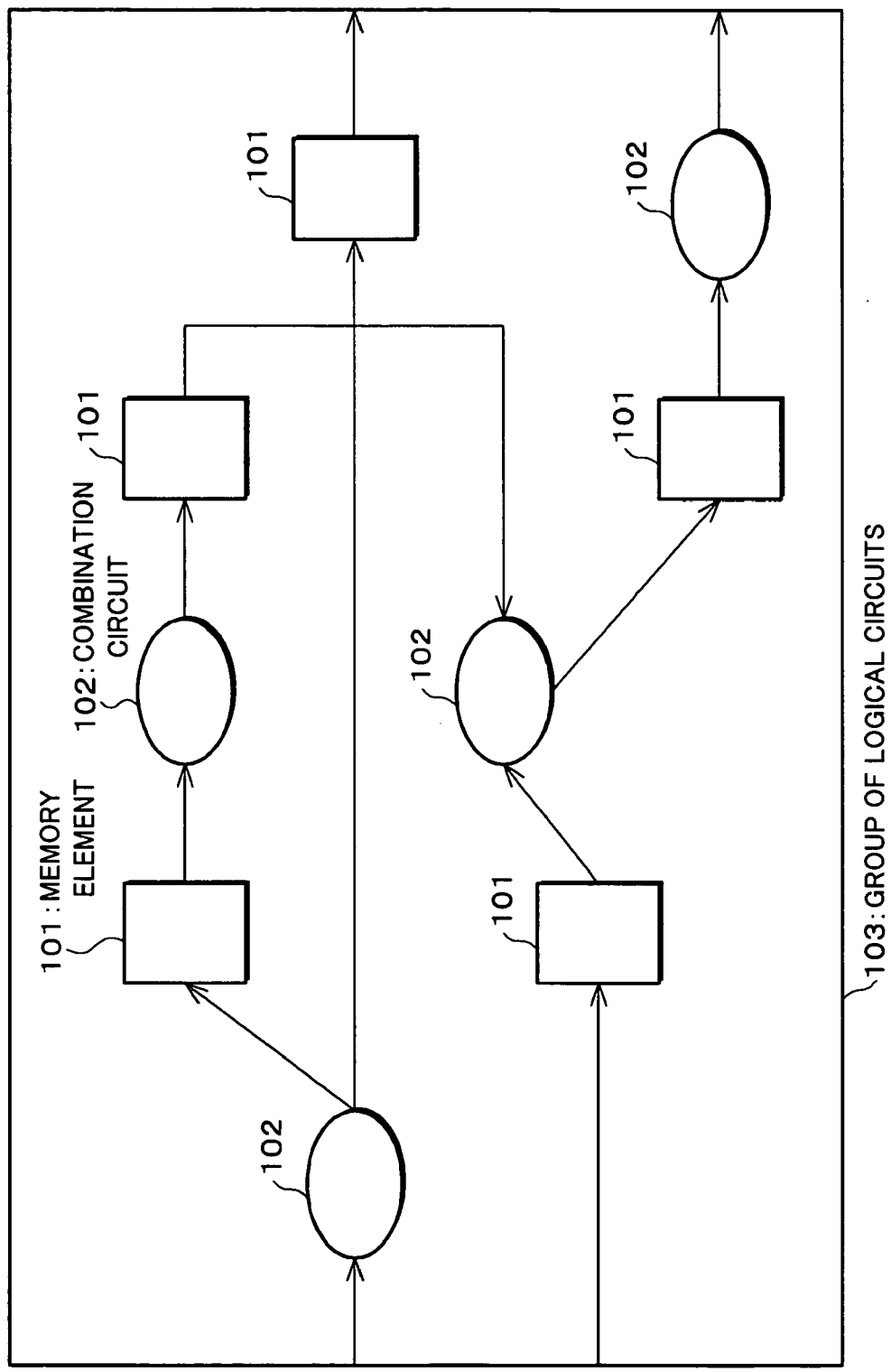
FIG. 12 is an explanatory drawing that shows the concept of a group of logical circuits.
Figure 13:
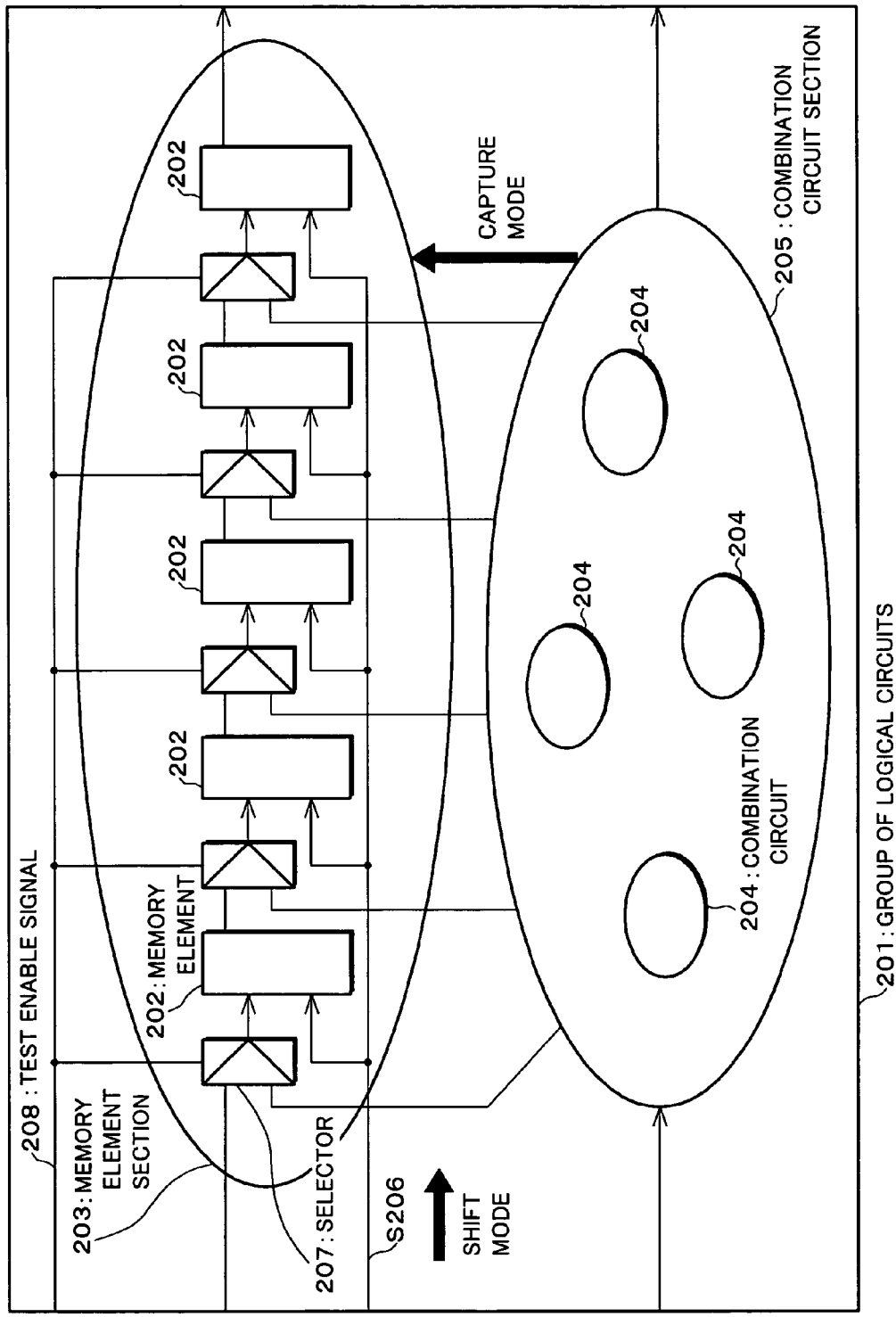
FIG. 13 is an explanatory drawing that shows the concept of a scanning test system.
Figure 14:
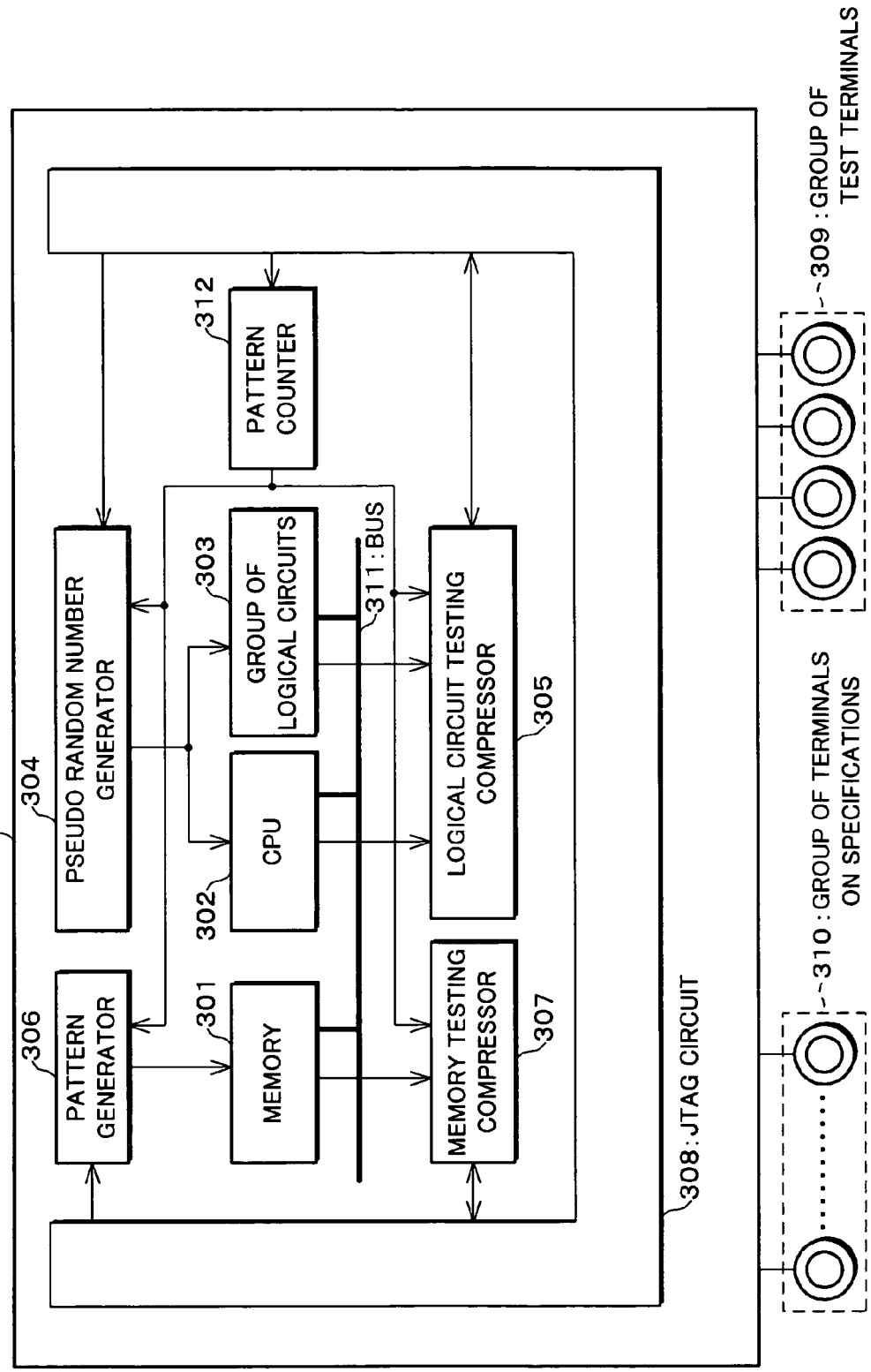
FIG. 14 is a block diagram that schematically shows the construction of a one-chip microcomputer provided with a conventional built-in test

Referring to FIGS. 10 through 11, the following description will discuss still another embodiment of the present invention. Here, for convenience of explanation, those members that have the same functions and that are described in embodiments 1 through 4 are indicated by the same reference numerals and the description thereof is omitted.

In the present embodiment, an explanation will be given of an IC card in which the one-chip microcomputer 70 described in the embodiment 4 is installed.

As illustrated in FIG. 10, the IC card 1 of the present embodiment is provided with the one-chip microcomputer 70 (see FIG. 7) and a group of terminals 21 on specifications that serve as an interface between the one-chip microcomputer 70 and external equipment.

The group of terminals 21 on specifications exert terminal functions standardized in the ISO 7816 as shown in FIG. 10 when the IC card is actually used normally. In other words, the respective terminals of the group of terminals 21 for specification allow signals VDD, GND, VPP, RFU1, RST, I/O, CLK and RFU2 to interface respectively.

Next, FIG. 11 shows a state in which the IC card 1 carries out its built-in self test. At the time of the built-in self test, the IC card 1 is connected to a tester 90 through test-use terminals among the group of terminals 21 on specifications.

As described in Embodiment 4, the one-chip microcomputer 70 is provided with the terminal switching circuit 73 so that the signal that is made to interface through the group of terminals 21 on specifications is selectively switched between the group of input/out signals P70 and the group of testing input/output signals P71. Thus, the group of input/output signals P70 on specifications of the IC card 1 are allowed to properly correspond to the group of testing input/output signals P71 of the test circuit 71. In other words, for example, the TDI terminal of the test circuit 71 that is a JTAG circuit is allowed to correspond to the RFU1 terminal of the IC card 1, while the TDO terminal, the TCK terminal and TMS terminal are allowed to correspond to the I/O terminal, the CLK terminal and the RFU2 terminal respectively; thus, the respective terminals are used in a shared manner.

Then, in order to switch the terminals, that is, in order to make switching between the group of input/output signals P70 on specifications and the group of testing input/output terminals P71, a switching instruction is externally given to the IC card 1. More specifically, in the case of a voltage detection method (FIG. 8) for detecting a special electric potential other than operational voltages that are set based upon specifications, a voltage instructing the switching operation is inputted through the VPP terminal. Moreover, in the case of a command detection method (FIG. 9) for detecting an input of a specific command, a command instructing the switching operation is inputted through the I/O terminal and after the terminal has been switched, the TDO signal is outputted from the I/O terminal. Additionally, these voltage and command may be inputted by using a tester 90.

As described above, at the time of testing, the IC card 1 of the present embodiment allows the TDI, TDO, TCK and TMS signals of the JTAG circuit (test circuit 71) to interface to external terminals by switching the terminal functions of the group of terminals 21 on specifications. Therefore, it is possible to activate the built-in self test of the installed one-chip microcomputer 70 and also to diagnose the results of the test by using the external tester 90.

As described above, the one-chip microcomputer of the present invention may be provided with: a CPU, a memory in which a program for controlling the operation of the CPU is stored, a group of logical circuits that are all connected to a bus, as well as a self test control circuit for inputting test patterns to the CPU, the group of logical circuits and the memory and for detecting the respective output signals, a self test activation circuit for setting an initial value for the self test control circuit and for activating the self test control circuit, and a terminal switching means which makes a switchover between a group of self-testing signals and a group of signals on specifications that are inputted and outputted through the same group of terminals.

Moreover, the control method for a one-chip microcomputer of the present invention, which is a control method for a one-chip microcomputer provided with CPU, a memory in which a program for controlling operations of the CPU is stored and a group of logical circuits that are all connected to a bus, may be provided with the steps of: setting an initial value for a self test control circuit so as to activate the self test control circuit (ninth process), allowing the self test control circuit to input test patterns to the CPU, the group of logical circuits and the memory so as to detect the respective output signals (tenth process), and switching a group of signals passing through the group of terminals so that at the time of a self test, a group of self-testing signals are inputted and outputted therethrough while, at the time of a normal use, a group of signals on specifications are inputted and outputted therethrough (eleventh process).

With the above-mentioned arrangement or method, a built-in self test is activated (the self test activation circuit, the ninth step) in accordance with an instruction from the CPU, and output signals of the CPU, the group of logical circuits and the memory are detected (the self test control circuit, the tenth step). Then, it is possible to switch a group of signals passing through the group of terminals so that at the time of a self test, a group of self-testing signals are inputted and outputted therethrough while, at the time of a normal use, a group of signals on specifications are inputted and outputted therethrough (the terminal switching means, the eleventh process).

Therefore, it is possible to carry out the built-in self test without causing an increase in the number of terminals on specifications. In other words, it becomes possible to carry out the built-in self test without the need for exclusively-used test terminals that have been conventionally required and for complex control externally given.

Since the above-mentioned arrangement or method solves the problem of an increase in the number of terminals in a one-chip microcomputer, it is possible to put the built-in self test into practice even in the case of one-chip microcomputers such as, for example, IC cards, which have fewer terminals. Moreover, in addition to the diagnosis on the test results of the group of logical circuits and the memory, it is also possible to diagnosis the test result on the CPU itself, which has been difficult to perform in a conventional device. Here, these diagnoses are carried out by the one-chip microcomputer itself without the need for any external test device.

The one-chip microcomputer of the present invention may be arranged so that the self test activation circuit is constituted by a test circuit confirming to the IEEE1149.1 standard.

This arrangement makes it possible to use a test circuit (JTAG circuit) conforming to the IEEE1149.1 standard as the self test activation circuit for activating the self test control circuit of the one-chip microcomputer.

Since the built-in self test is externally activated by using control signals of the JTAG circuit and since the diagnosis on the test results is carried out externally, it is possible to carry out a scan test on the CPU itself and also to diagnose the test results. Moreover, since the JTAG circuit conforming to a unified standard is adopted as the test circuit, it is possible to shorten designing and developing periods for the one-chip microcomputer. Furthermore, the application of the terminal switching means in addition to the JTAG circuit makes it possible to carry out the built-in self test by using the arrangement and method conforming to the unified standard without increasing the number of terminals on specifications.

Moreover, the one-chip microcomputer of the present invention may be arranged so that the terminal switching means is provided with a special voltage detection circuit which detects a predetermined electric potential for instructing a switchover between the groups of signals that are inputted to predetermined terminals of the group of terminals.

In this arrangement, when the special voltage detection circuit detects the predetermined electric potential, the terminal switching means makes a switchover between the groups of signals so that the self test activation circuit can be directly controlled from outside. In other words, the terminal functions of the group of shared terminals can be externally controlled by an electric potential inputted to a predetermined terminal of the one-chip microcomputer, without the need for newly adding exclusively-used terminals so as to switch the terminal functions.

The one-chip microcomputer of the present invention may also be arranged so that the terminal switching means is provided with a command detection circuit which detects a command for instructing a switchover between the groups of terminals that is inputted to a predetermined terminal of the group of terminals.

In this arrangement, when the command detection circuit detects the predetermined command, the terminal switching means makes a switchover between the groups of signals so that the self test activation circuit can be directly controlled from outside. In other words, the terminal functions of the group of shared terminals can be externally controlled by a command inputted to a predetermined terminal of the one-chip microcomputer, without the need for newly adding exclusively-used terminals so as to switch the terminal functions.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A one-chip microcomputer comprising:
    a CPU;
    a memory in which a program for controlling the operation of the CPU is stored;
    a group of logical circuits;
    a self test control circuit for inputting test patterns to the group of logical circuits and the memory and for detecting the respective output signals, in accordance with an instruction from the CPU; and
    a self test activation circuit for setting an initial value for the self test control circuit and for activating the self test control circuit, in accordance with an instruction from the CPU wherein the self-test activation circuit outputs test start signals to start a self-test operation.

2. The one-chip microcomputer as defined in claim 1, wherein the CPU diagnoses self tests of the group of logical circuits and the memory by comparing output signals from the group of the logical circuits and the memory detected by the self test control circuit with expected values stored in the memory.

3. The one-chip microcomputer as defined in claim 2, wherein the CPU outwardly outputs results of the diagnosis through a terminal of a group of terminals on specifications that are used for inputting and outputting a group of signals on specifications at the time of normal use.

4. The one-chip microcomputer as defined in claim 1, wherein the CPU outwardly outputs output signals from the group of logical circuits and the memory detected by the self test control circuit through a terminal of a group of terminals on specifications that are used for inputting and outputting a group of signals on specifications at the time of normal use.

5. The one-chip microcomputer as defined in claim 1, wherein, in accordance with an instruction from the CPU, the self test control circuit also inputs a test pattern to the CPU in addition to the group of logical circuits and the memory so as to detect the resulting output signal.

6. The one-chip microcomputer as defined in claim 5, further comprising:
    a test result output circuit for outwardly outputting the output signals from the CPU, the group of logical circuits and the memory that have been detected by the self test control circuit.

7. The one-chip microcomputer as defined in claim 6, wherein the test result output circuit outwardly outputs the output signals from the CPU, the group of logical circuits and the memory through a terminal of a group of terminals on specifications that are used for inputting and outputting a group of signals on specifications at the time of normal use.

8. The one-chip microcomputer as defined in claim 1, wherein the self test activation circuit includes an activation register that is a latch circuit for activating the self test control circuit.

9. The one-chip microcomputer as defined in claim 1, wherein the self test activation circuit includes a built-in self test activation pattern generator that is a counter circuit for setting a pattern of a generated initial value in the self test control circuit.

10. A one-chip microcomputer comprising:
a CPU;
a memory in which a program for controlling the operation of the CPU is stored;
a group of logical circuits;
a self test control circuit for inputting test patterns to the group of logical circuits and the memory and for detecting the respective output signals, in accordance with an instruction from the CPU;
a self test activation circuit for setting an initial value for the self test control circuit and for activating the self test control circuit, in accordance with an instruction from the CPU; and
a reset circuit which, after the output signals from the CPU, the group of logical circuits and the memory have been detected by the self test control circuit, resets the CPU so as to allow the CPU to execute a program for diagnosing the CPU, the group of logical circuits and the memory based upon the respective output signals, wherein, in accordance with an instruction from the CPU, the self test control circuit also inputs a test pattern to the CPU in addition to the group of logical circuits and the memory so as to detect the resulting output signal.

11. A one-chip microcomputer comprising:
a CPU;
a memory in which a program for controlling the operation of the CPU is stored;
a group of logical circuits;
a self test control circuit for inputting test patterns to the group of logical circuits and the memory and for detecting the respective output signals, in accordance with an instruction from the CPU;
a self test activation circuit for setting an initial value for the self test control circuit and for activating the self test control circuit, in accordance with an instruction from the CPU; and
a reset circuit which, after the output signals from the CPU, the group of logical circuits and the memory have been detected by the self test control circuit, resets the CPU so as to allow the CPU to execute a program for diagnosing the CPU, the group of logical circuits and the memory based upon the respective output signals, wherein, in accordance with an instruction from the CPU, the self test control circuit also inputs a test pattern to the CPU in addition to the group of logical circuits and the memory so as to detect the resulting output signal, wherein the CPU, when reset, discriminates whether the resetting is an initialization at the time of application of power or it is an initialization made by the reset circuit after completion of a built-in self test.

12. A one-chip microcomputer comprising:
a CPU;
a memory in which a program for controlling the operation of the CPU is stored;
a group of logical circuits;
a self test control circuit for inputting test patterns to the group of logical circuits and the memory and for detecting the respective output signals, in accordance with an instruction from the CPU;
a self test activation circuit for setting an initial value for the self test control circuit and for activating the self test control circuit, in accordance with an instruction from the CPU; and
a reset circuit which, after the output signals from the CPU, the group of logical circuits and the memory have been detected by the self test control circuit, resets the CPU so as to allow the CPU to execute a program for diagnosing the CPU, the group of logical circuits and the memory based upon the respective output signals, wherein, in accordance with an instruction from the CPU, the self test control circuit also inputs a test pattern to the CPU in addition to the group of logical circuits and the memory so as to detect the resulting output signal, wherein the CPU, when reset, discriminates whether the resetting is an initialization at the time of application of power or it is an initialization made by the reset circuit after completion of a built-in self test, wherein the CPU outwardly outputs results of the diagnosis through a terminal of a group of terminals on specifications that are used for inputting and outputting a group of signals on specifications at the time of normal use.

13. A one-chip microcomputer comprising:
a CPU;
a memory in which a program for controlling the operation of the CPU is stored;
a group of logical circuits;
a self test control circuit for inputting test patterns to the group of logical circuits and the memory and for detecting the respective output signals, in accordance with an instruction from the CPU;
a self test activation circuit for setting an initial value for the self test control circuit and for activating the self test control circuit, in accordance with an instruction from the CPU; and
a reset circuit which, after the output signals from the CPU, the group of logical circuits and the memory have been detected by the self test control circuit, resets the CPU so as to allow the CPU to execute a program for diagnosing the CPU, the group of logical circuits and the memory based upon the respective output signals, wherein, in accordance with an instruction from the CPU, the self test control circuit also inputs a test pattern to the CPU in addition to the group of logical circuits and the memory so as to detect the resulting output signal, wherein the CPU, when reset, discriminates whether the resetting is an initialization at the time of application of power or it is an initialization made by the reset circuit after completion of a built-in self test, wherein the CPU outwardly outputs the output signals from the CPU, the group of logical circuits and the memory through a terminal of a group of terminals on specifications that are used for inputting and outputting a group of signals on specifications at the time of normal use.

14. A one-chip microcomputer comprising:
    a CPU;
    a memory in which a program for controlling the operation of the CPU is stored;
    a group of logical circuits;
    a self test control circuit for inputting test patterns to the CPU, the group of logical circuits and the memory and for detecting the respective output signals;
    a self test activation circuit for setting an initial value for the self test control circuit and for activating the self test control circuit, wherein the self-test activation circuit outputs test start signals to start the self-test operation; and
    a terminal switching means which makes a switchover between a group of self-testing signals and a group of signals on specifications that are inputted and outputted through the same group of terminals.

15. The one-chip microcomputer as defined in claim 14, wherein the self test activation circuit is a test circuit conforming to the IEEE1149.1 standard.

16. A one-chip microcomputer comprising:
    a CPU;
    a memory in which a program for controlling the operation of the CPU is stored;
    a group of logical circuits;
    a self test control circuit for inputting test patterns to the CPU, the group of logical circuits and the memory and for detecting the respective output signals;
    a self test activation circuit for setting an initial value for the self test control circuit and for activating the self test control circuit; and
    a terminal switching means which makes a switchover between a group of self-testing signals and a group of signals on specifications that are inputted and outputted through the same group of terminals, wherein the terminal switching means includes a special voltage detection circuit which detects a predetermined electric potential that is inputted to a predetermined terminal of the group of terminals so as to instruct a switchover between the groups of signals.

17. A one-chip microcomputer comprising:
    a CPU;
    a memory in which a program for controlling the operation of the CPU is stored;
    a group of logical circuits;
    a self test control circuit for inputting test patterns to the CPU, the group of logical circuits and the memory and for detecting the respective output signals;
    a self test activation circuit for setting an initial value for the self test control circuit and for activating the self test control circuit; and
    a terminal switching means which makes a switchover between a group of self-testing signals and a group of signals on specifications that are inputted and outputted through the same group of terminals, wherein the terminal switching means includes a command detection circuit which detects a command that is inputted to a predetermined terminal of the group of terminals so as to instruct a switchover between the groups of terminals.

18. A control method for a one-chip microcomputer, which is applied to a one-chip microcomputer provided with CPU, a memory in which a program for controlling operations of the CPU is stored and a group of logical circuits, comprising steps of:
    setting an initial value for a self test control circuit so as to activate the self test control circuit in accordance with an instruction from the CPU;
    outputting test start signals to start a self-test operation; and
    allowing the self test control circuit to input test patterns to the group of logical circuits and the memory so as to detect the respective output signals, in accordance with an instruction from the CPU.

19. The control method for a one-chip microcomputer as defined in claim 18, further comprising the step of:
    diagnosing self tests of the group of logical circuits and the memory by comparing output signals from the group of the logical circuits and the memory detected by the self test control circuit with expected values stored in the memory.

20. The control method for a one-chip microcomputer as defined in claim 19, further comprising the step of:
    outwardly outputting the results of the diagnosis through a terminal of a group of terminals on specifications that are used for inputting and outputting a group of signals on specifications at the time of normal use.

21. The control method for a one-chip microcomputer as defined in claim 18, further comprising the steps of:
    outwardly outputting output signals from the group of logical circuits and the memory detected by the self test control circuit through a terminal of a group of terminals on specifications that are used for inputting and outputting a group of signals on specifications at the time of normal use; and
    externally carrying out diagnosis on self tests of the group of logical circuits and the memory by comparing output signals from the group of the logical circuits and the memory detected by the self test control circuit with expected values stored in the memory.

22. A control method for a one-chip microcomputer, which is applied to a one-chip microcomputer provided with CPU, a memory in which a program for controlling operations of the CPU is stored and a group of logical circuits, comprising steps of:
    setting an initial value for a self test control circuit so as to activate the self test control circuit in accordance with an instruction from the CPU;
    outputting test start signals to start a self-test operation;
    allowing the self test control circuit to input test patterns to the CPU, the group of logical circuits and the memory so as to detect the respective output signals in accordance with an instruction of the CPU; and
    outwardly outputting the output signals from the CPU, the group of logical circuits and the memory detected by the self test control circuit.

23. The control method for one-chip microcomputer as defined in claim 22, further comprising the step of:
    in said step for outwardly outputting the output signals, outwardly outputting output signals of the CPU, the group of logical circuits and memory through a terminal of a group of terminals on specifications that are used for inputting and outputting a group of signals on specifications at the time of normal use.

24. The control method for one-chip microcomputer as defined in claim 23, further comprising the step of:
    externally carrying out diagnosis on self tests of the CPU, the group of logical circuits and the memory by comparing the output signals with expected values.

25. A control method for a one-chip microcomputer, which is applied to a one-chip microcomputer provided with a CPU, a memory in which a program for controlling operations of the CPU is stored and a group of logical circuits, comprising the steps of:

setting an initial value for a self test control circuit so as to activate the self test control circuit in accordance with an instruction from the CPU;

allowing the self test control circuit to input test patterns to the CPU, the group of logical circuits and the memory so as to detect the respective output signals in accordance with an instruction from the CPU; and after the output signals from the CPU, the group of logical circuits and the memory have been detected by the self test control circuit, resetting the CPU so as to allow the CPU to execute a program for diagnosing the CPU, the group of logical circuits and the memory based upon the respective output signals.

26. The control method for a one-chip microcomputer as defined in claim 25, comprising the step of:

upon completion of resetting, discriminating whether the resetting is an initialization at the time of application of power or it is an initialization after completion of a built-in self test.

27. The control method for a one-chip microcomputer as defined in claim 25, further comprising the step of:

outwardly outputting the results of the diagnosis through a terminal of a group of terminals on specifications that are used for inputting and outputting a group of signals on specifications at the time of normal use.

28. The control method for a one-chip microcomputer as defined in claim 25, further comprising the steps of:

outwardly outputting output signals from the CPU, the group of logical circuits and the memory detected by the self test control circuit through a terminal of a group of terminals on specifications that are used for inputting and outputting a group of signals on specifications at the time of normal use; and externally carrying out diagnosis on self tests of the CPU, the group of logical circuits and the memory by comparing output signals from the CPU, the group of the logical circuits and the memory detected by the self test control circuit with expected values stored in the memory.

29. A control method for a one-chip microcomputer, which is applied to a control method for a one-chip microcomputer provided with CPU, a memory in which a program for controlling operations of the CPU is stored and a group of logical circuits, comprising the steps of:

setting an initial value for a self test control circuit so as to activate the self test control circuit;

outputting test start signals by a self-test activation circuit to start a self-test operation;

allowing the self test control circuit to generate and input test patterns to the CPU, the group of logical circuits and the memory so as to detect the respective output signals; and switching a group of signals passing through the group of terminals so that at the time of a self test, a group of self-testing signals are inputted and outputted therethrough while, at the time of a normal use, a group of signals on specifications are inputted and outputted therethrough.

30. An IC card which includes a one-chip microcomputer, said one-chip microcomputer comprising:

a CPU;

a memory in which a program for controlling the operation of the CPU is stored;

a group of logical circuits;

a self test control circuit for inputting test patterns to the group of logical circuits and the memory and for detecting the respective output signals, in accordance with an instruction from the CPU; and a self test activation circuit for setting an initial value for the self test control circuit and for activating the self test control circuit, in accordance with an instruction from the CPU, wherein the self-test activation circuit outputs test start signals to start a self-test operation.

31. An IC card which includes a one-chip microcomputer, said one-chip microcomputer comprising:

a CPU;

a memory in which a program for controlling the operation of the CPU is stored;

a group of logical circuits;

a self test control circuit for inputting test patterns to the CPU, the group of logical circuits and the memory and for detecting the respective output signals, in accordance with an instruction from the CPU;

a self test activation circuit for setting an initial value for the self test control circuit and for activating the self test control circuit, in accordance with an instruction from the CPU wherein the self-test activation circuit outputs test start signals to start a self-test operation; and a test result output circuit for outwardly outputting the output signals from the CPU, the group of logical circuits and the memory that have been detected by the self test control circuit.

32. An IC card which includes a one-chip microcomputer, said one-chip microcomputer comprising:

a CPU;

a memory in which a program for controlling the operation of the CPU is stored;

a group of logical circuits;

a self test control circuit for inputting test patterns to the CPU, the group of logical circuits and the memory and for detecting the respective output signals, in accordance with an instruction from the CPU;

a self test activation circuit for setting an initial value for the self test control circuit and for activating the self test control circuit, in accordance with an instruction from the CPU; and a reset circuit which, after the output signals from the CPU, the group of logical circuits and the memory have been detected by the self test control circuit, resets the CPU so as to allow the CPU to execute a program for diagnosing the CPU, the group of logical circuits and the memory based upon the respective output signals.

33. An IC card which includes a one-chip microcomputer, said one-chip microcomputer comprising:

a CPU;

a memory in which a program for controlling the operation of the CPU is stored;

a group of logical circuits;

a self test control circuit for inputting test patterns to the CPU, the group of logical circuits and the memory and for detecting the respective output signals;

a self test activation circuit for setting an initial value for the self test control circuit and for activating the self test control circuit, wherein the self-test activation circuit outputs test start signals to start a self-test operation; and a terminal switching means which makes a switchover between a group of self-testing signals and a group of signals on specifications that are inputted and outputted through the same group of terminals.

34. The IC card which includes a one-chip microcomputer, as defined in claim 33, comprising:
a group of terminals on specifications that inputs and outputs a group of signals on specifications at the time of normal use,
wherein, at the time of a self test, a terminal of said group of terminals is used so as to input and output a group of self testing signals.

* * * * *